US012796051B2

(12) United States Patent
Tsai et al.

(10) Patent No.: US 12,796,051 B2
(45) Date of Patent: Nov. 10, 2026

(54) SEMICONDUCTOR DEVICE WITH CONDUCTIVE FEATURE CONNECTING TRANSISTORS

(71) Applicant: Taiwan Semiconductor Manufacturing Company, Ltd., Hsinchu (TW)

(72) Inventors: Ming-Heng Tsai, Taipei City (TW); Chun-Sheng Liang, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 448 days.

(21) Appl. No.: 18/459,448

(22) Filed: Sep. 1, 2023

(65) Prior Publication Data

US 2025/0081578 A1 Mar. 6, 2025

(51) Int. Cl.

| | |
|---|---|
| ***H10D 30/67*** | (2025.01) |
| ***H10B 10/00*** | (2023.01) |
| ***H10D 30/43*** | (2025.01) |
| ***H10D 62/10*** | (2025.01) |
| ***H10D 64/23*** | (2025.01) |
| ***H10D 84/83*** | (2025.01) |
| ***H10W 20/43*** | (2026.01) |

(52) U.S. Cl.

CPC ........... *H10D 64/251* (2025.01); *H10B 10/12* (2023.02); *H10D 30/43* (2025.01); *H10D 30/6735* (2025.01); *H10D 30/6757* (2025.01); *H10D 62/121* (2025.01); *H10D 84/83* (2025.01); *H10W 20/43* (2026.01)

(58) Field of Classification Search

CPC .... H10B 10/12; H10B 10/125; H10D 30/014; H10D 30/43; H10D 30/6735; H10D 30/6757; H10D 62/121; H10D 64/251; H10D 84/0149; H10D 84/0186; H10D 84/83; H10D 84/832; H10D 84/851; H10W 20/0698; H10W 20/43

See application file for complete search history.

(56) References Cited

U.S. PATENT DOCUMENTS

| | | | | |
|---|---|---|---|---|
| 9,209,247 | B2 | 12/2015 | Colinge et al. | |
| 9,236,267 | B2 | 1/2016 | De et al. | |
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2022/0328499 | A1* | 10/2022 | Liaw | H10B 10/125 |
| 2023/0260832 | A1* | 8/2023 | Lin | H10P 14/69391 257/751 |

* cited by examiner

*Primary Examiner* — Nelson Garces
(74) *Attorney, Agent, or Firm* — JCIPRNET

(57) ABSTRACT

A semiconductor device includes a first transistor, a second transistor and an interconnect structure. The interconnect structure is disposed over the first transistor and the second transistor, wherein the interconnect structure includes a first conductive via electrically connecting a first source/drain contact of the first transistor to a second gate structure of the second transistor. The first conductive via is in contact with a top surface of the first source/drain contact and a side surface of the first source/drain contact.

20 Claims, 26 Drawing Sheets

SEMICONDUCTOR DEVICE WITH CONDUCTIVE FEATURE CONNECTING TRANSISTORS

BACKGROUND

The semiconductor integrated circuit (IC) industry has witnessed remarkable growth, driven by advancements in IC materials and design. With each successive generation, ICs have become smaller and more intricate compared to their predecessors. This evolution has led to an increase in functional density (i.e., the number of interconnected devices per chip area), while the geometry size (i.e., the smallest component (or line) that can be created using a fabrication process) has decreased. Scaling down of semiconductor device has yielded several advantages, including enhanced production efficiency and reduced costs. However, this downsizing process has also introduced greater intricacies in the processing and manufacturing of ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
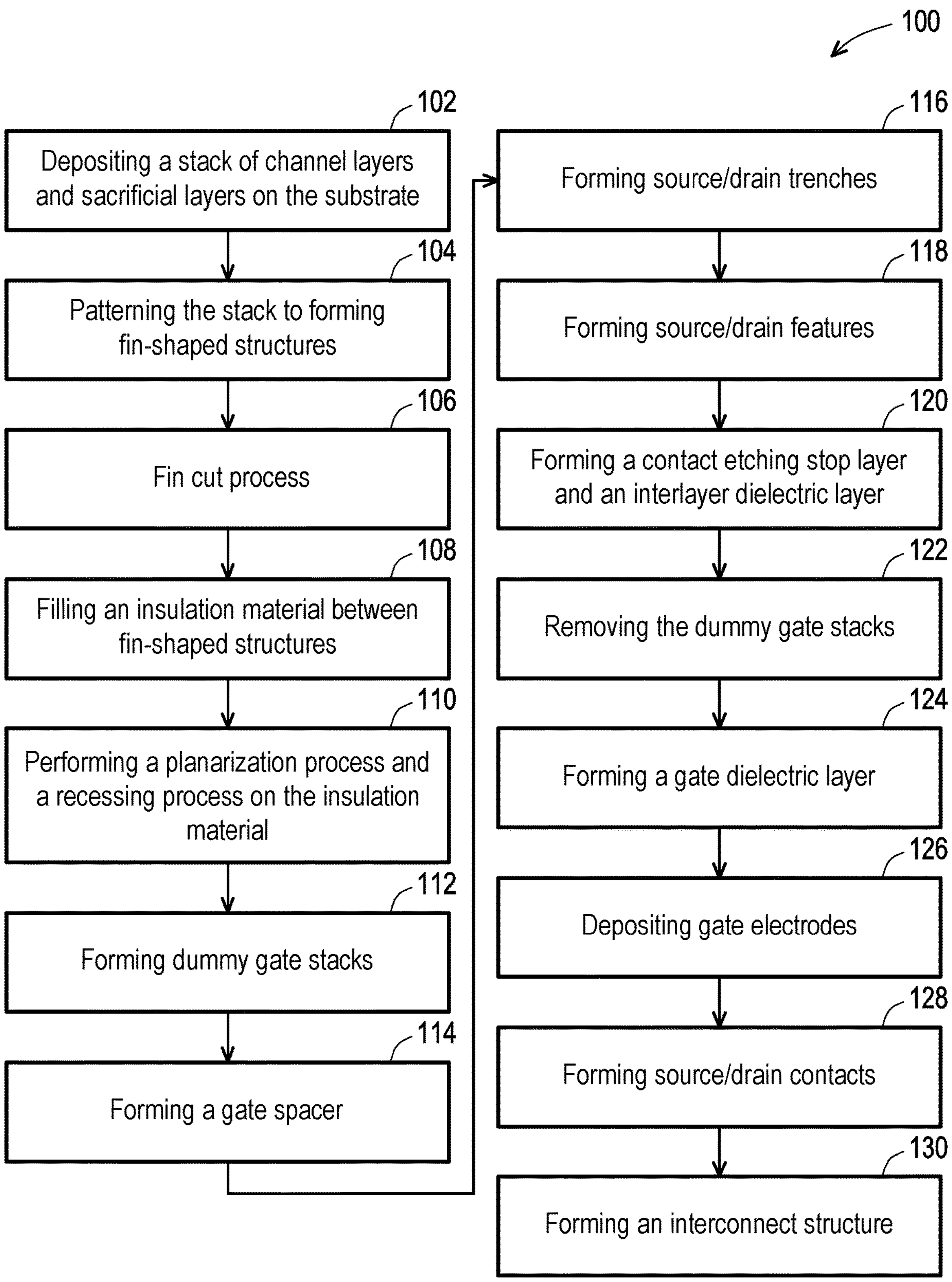
FIG. 1 illustrates a flowchart of a method for forming a semiconductor device, according to one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

In addition, terms, such as "first", "second", "third" and the like, may be used herein for ease of description to describe similar or different element(s) or feature(s) as illustrated in the figures, and may be used interchangeably depending on the order of the presence or the contexts of the description.

The present disclosure is generally related to a connection structure between a source/drain contact in one transistor and a gate structure in another one transistor. The connection structure is designed to extend from the top surfaces of the source/drain contact and gate structure to the space laterally between the source/drain contact and the gate structure, thereby increasing the contact areas between the connection structure and the source/drain contact and between the connection structure and the gate structure, thereby reducing the resistance value between the source/drain contact and the gate structure.

In some embodiments, the connection structure between the source/drain contact and the gate structure may be referred to as a "butted contact," and the butted contact is located within an interconnect structure disposed above the transistors. In some embodiments, by selectively etching part of the gate spacer, the interlayer dielectric layer, and/or the etching stop layer located between the source/drain contact and the gate electrode, the subsequently formed butted contact can be positioned laterally between the source/drain contact and the gate electrode.

The various aspects of the present disclosure will now be described in more detail with reference to the figures. FIG. 1 illustrates a flowchart of a method 100 of forming a semiconductor device from a workpiece according to one or more aspects of the present disclosure. Method 100 is merely an example and is not intended to limit the present disclosure to what is explicitly illustrated in method 100.

Figure 2:
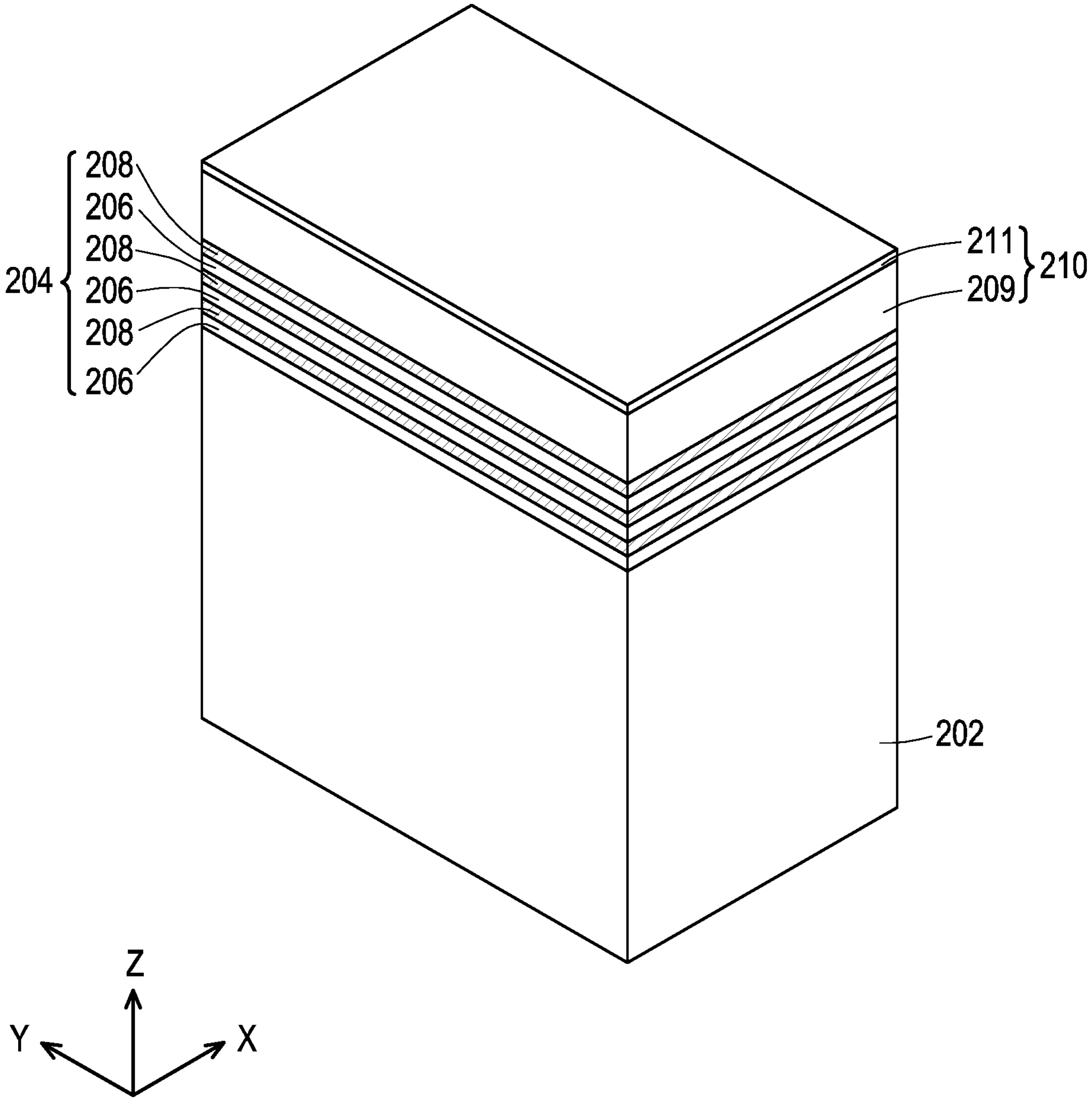
FIG. 2 to FIG. 16 illustrate schematic diagrams of various aspects of a method for forming a semiconductor device, according to one or more embodiments of the present disclosure.

Referring to FIGS. 1 and 2, method 100 begins with a step 102, where a stack 204 is disposed on a substrate 202. In one embodiment, the substrate 202 may be a silicon (Si) substrate. In some other embodiments, the substrate 202 may include other semiconductors such as germanium (Ge), silicon germanium (SiGe), or III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B)), for forming different types of devices. The n-type wells and the p-type wells may be formed using ion implantation or thermal diffusion.

Referring to FIG. 2, the stack 204 includes multiple channel layers 208 interleaved with sacrificial layers 206. These layers have different semiconductor compositions. In certain implementations, the channel layers 208 are made of silicon (Si), while the sacrificial layers 206 are made of silicon germanium (SiGe). The presence of additional germanium content in the sacrificial layers 206 enables selective removal or recessing of these layers without causing significant damage to the channel layers 208. The sacrificial layers 206 and channel layers 208 can be deposited using an epitaxial process. The stack 204 may be epitaxially deposited using techniques such as chemical vapor deposition (CVD), including vapor-phase epitaxy (VPE) and ultra-high vacuum CVD (UHV-CVD), as well as molecular beam epitaxy (MBE), or other suitable processes. The sacrificial layers 206 and channel layers 208 are alternately deposited one after another to form the stack 204.

It should be noted that the illustration in FIG. 2 depicts three layers of sacrificial layers 206 and three layers of channel layers 208 arranged in an alternating and vertical manner. However, this arrangement serves as an example for illustrative purposes only and does not impose limitations beyond what is explicitly stated in the claims. The actual number of layers depends on the desired number of channel members for the semiconductor device. In some embodiments, the number of channel layers 208 ranges from 2 to 10.

For the purpose of patterning, a hard mask layer 210 is placed on top of the stack 204. The hard mask layer 210 can be a single layer or a multilayer structure. In one example, the hard mask layer 210 includes a first layer 209 and a second layer 211 positioned above the first layer 209. In certain embodiments, the first layer 209 is made of silicon nitride, while the second layer 211 is composed of silicon oxide. Alternatively, in some embodiments, the first layer may be made of silicon germanium (SiGe), while the second layer is made of silicon (Si).

Figure 3A:
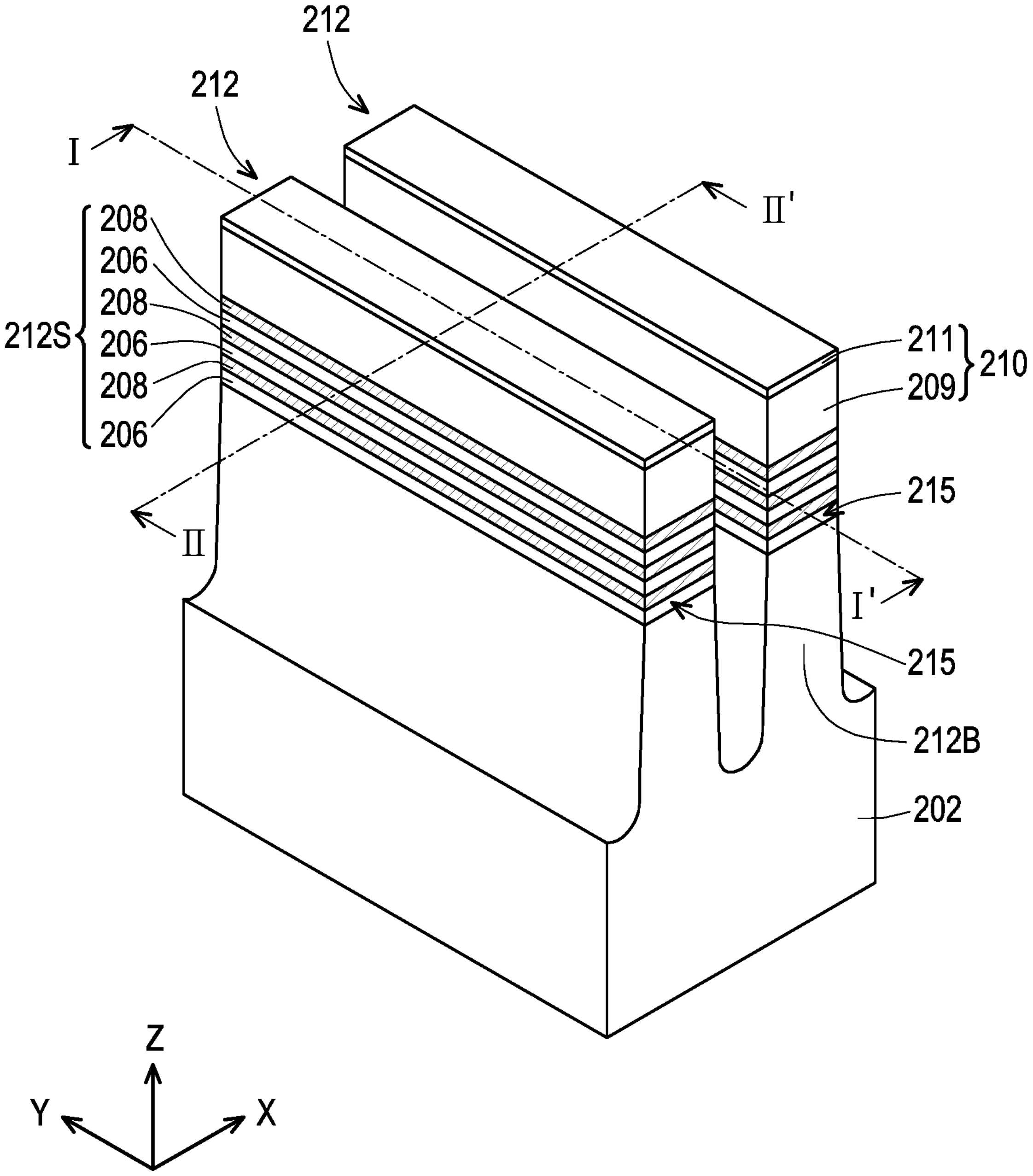
Figure 3C:
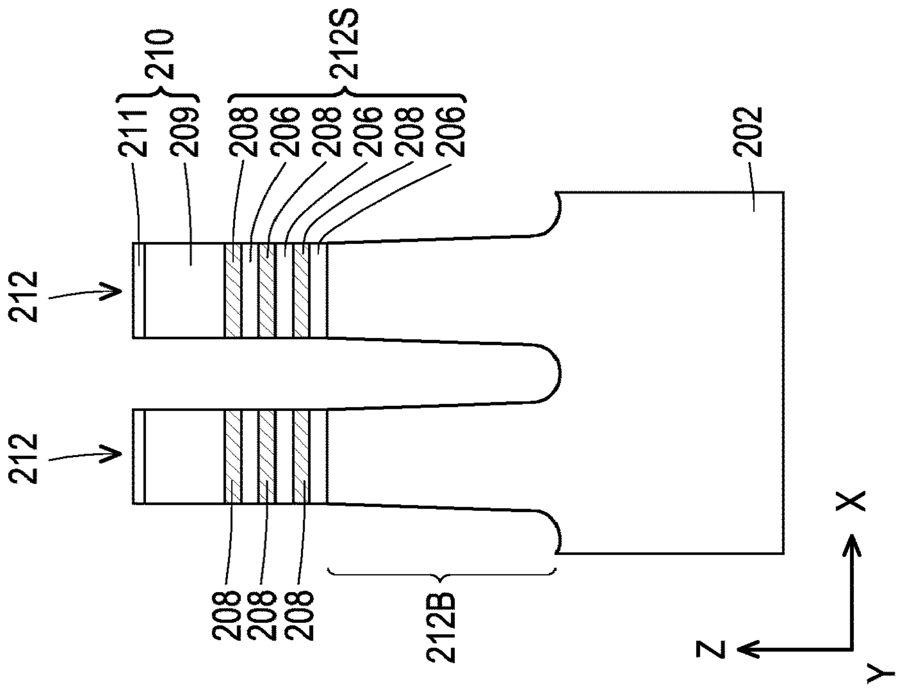
Figure 3B:
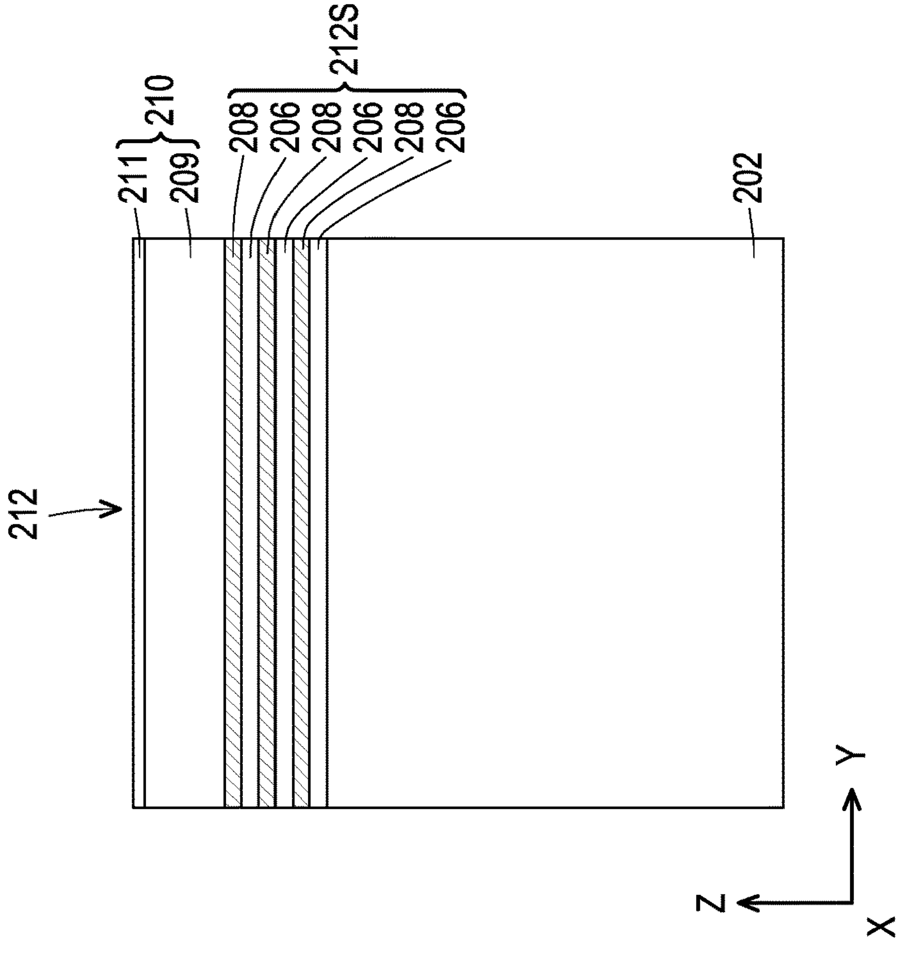

FIG. 3B and FIG. 3C correspond to the cross-sectional views of line I-I' and line II-II' in FIG. 3A, respectively. Referring to FIGS. 1, 3A, 3B, and 3C, method 100 involves the formation of fin-shaped structures 212 in step 104. As depicted in FIGS. 3A, 3B, and 3C, each fin-shaped structure 212 includes a base portion 212B, which is derived from a section of the substrate 202, and a stack portion 212S, which is derived from the stack 204. The stack portion 212S is positioned above the base portion 212B. In some embodiments, during step 104, the stack 204 and the substrate 202 undergo patterning to create the fin-shaped structures 212. These fin-shaped structures 212 extend lengthwise along the Y direction and vertically along the Z direction from the substrate 202.

To form the fin-shaped structures 212, suitable processes such as double-patterning or multi-patterning techniques may be employed. Generally, double-patterning or multi-patterning processes involve the integration of photolithography and self-aligned processes, enabling the creation of patterns with smaller pitches than those achievable through a single, direct photolithography process. The patterning process of the fin-shaped structures 212 may further includes an etching process performed to the stack 204 and the substrate 202. The etching process may involve techniques such as dry etching, wet etching, reactive ion etching (RIE), or other suitable processes.

Figure 4:
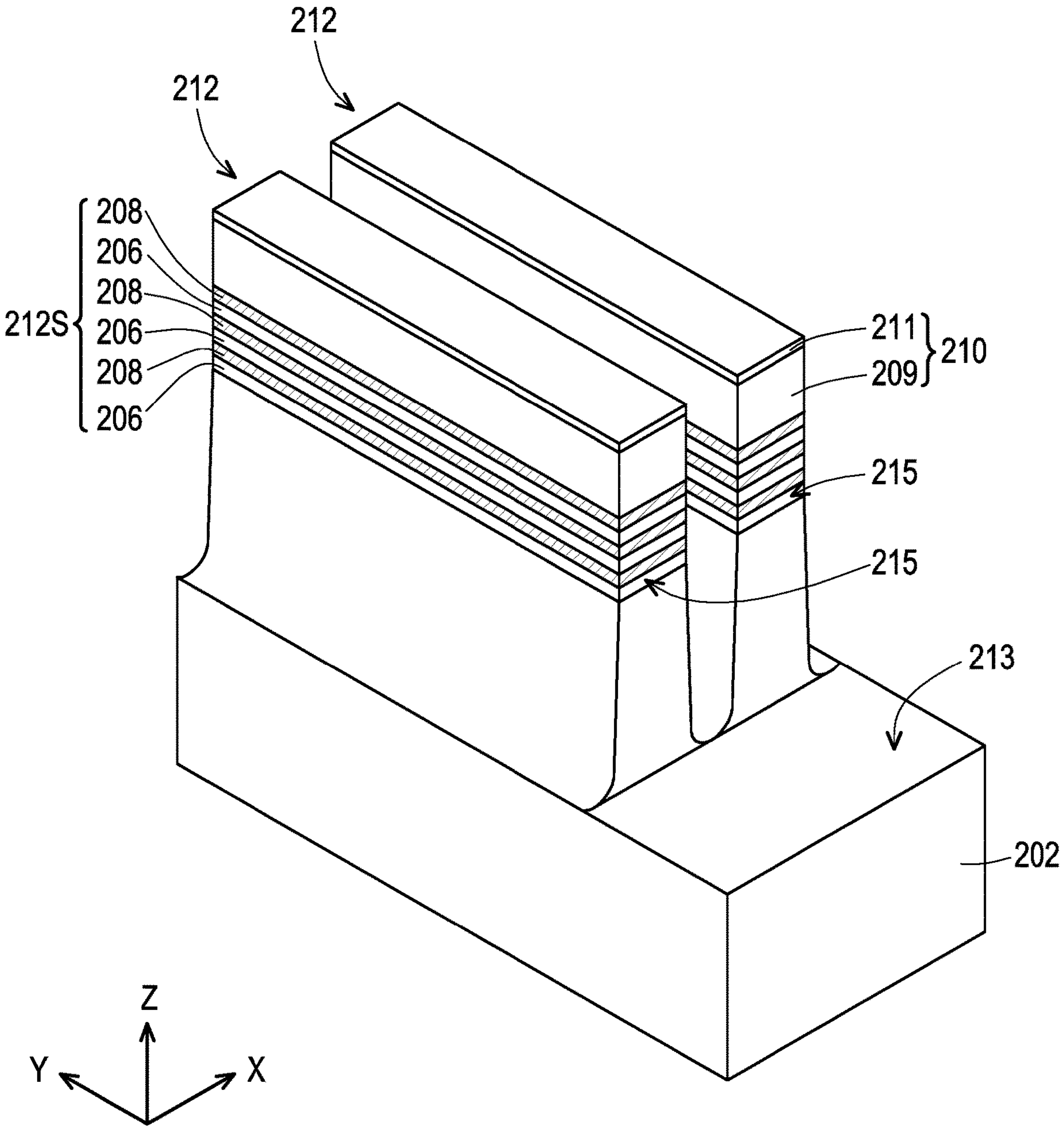

Referring to FIGS. 1 and 4, method 100 involves a step 106 which includes the fin cut process. In certain embodiments, the fin-shaped structures 212 can be segmented through a fin cut process to create a fin cut opening 213, as illustrated in FIG. 4. Within the fin cut opening 213, each fin-shaped structure 212 exhibits an exposed end surface 215. Additionally, other surfaces of the substrate 202 may also become exposed within the fin cut opening 213. The end surface 215 can also be referred to as the end sidewall 215. It should be noted that, unless a mask is utilized, a subsequent conformal or blanket deposition of material may lead to the deposition of material within the fin cut opening 213 and onto the end surface 215.

Figure 5A:
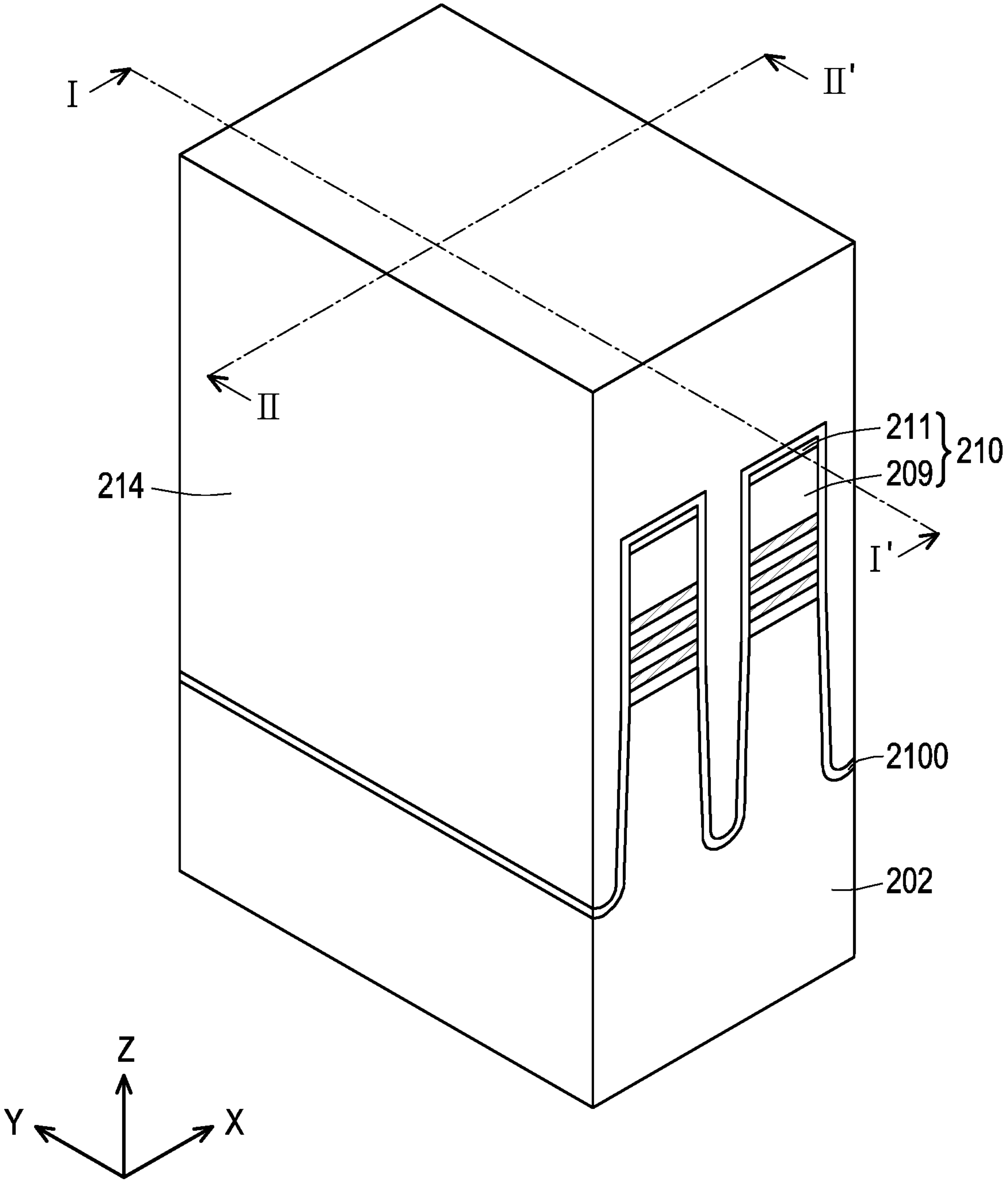
Figure 5C:
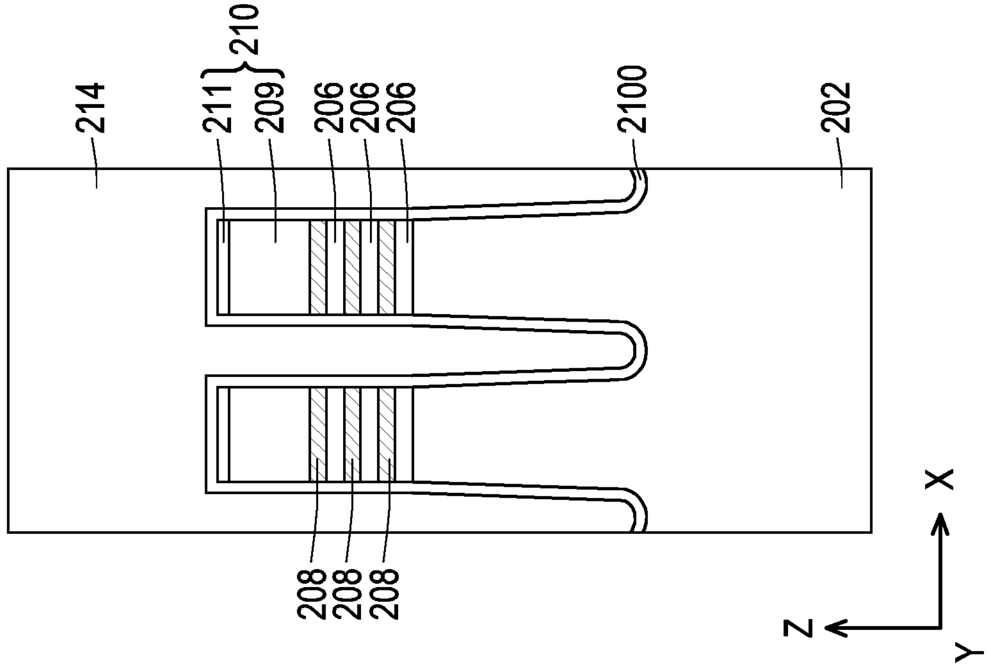
Figure 5B:
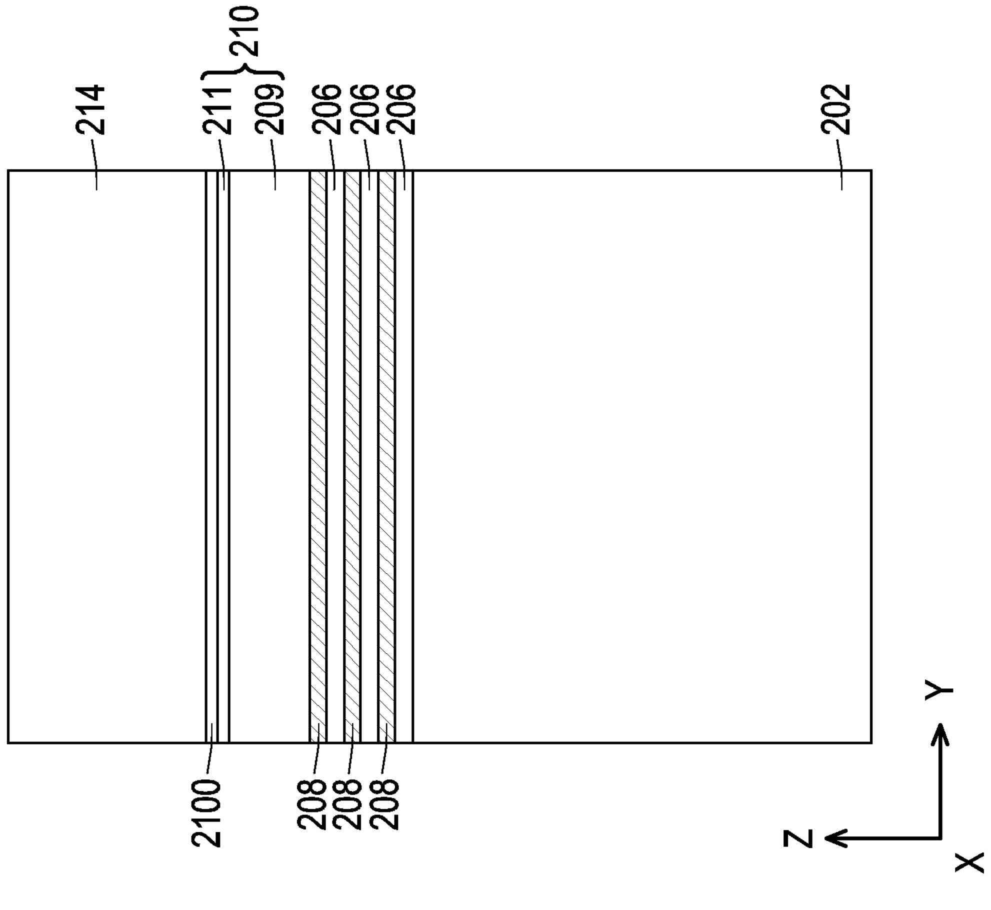

FIG. 5B and FIG. 5C correspond to the cross-sectional views of line I-I' and line II-II' in FIG. 5A, respectively. FIG. 6B and FIG. 6C correspond to the cross-sectional views of line I-I' and line II-II' in FIG. 6A, respectively. Referring to FIGS. 1, 5A to 5C and 6A to 6C, method 100 includes a step 108 where an insulation material 214 is formed between fin-shaped structures 212. Following the fin cut process, as shown in FIGS. 5A to 5C, the insulation material 214 is created between adjacent fin-shaped structures 212. The insulation material 214 is also referred to as a shallow trench isolation (STI) feature 214. In an example process, a dielectric material is initially deposited over the substrate 202 and the fin-shaped structures 212, filling the trenches between the fin-shaped structures 212 with this dielectric material. It should be noted that the insulation material 214 is also deposited within the fin cut opening 213 (shown in FIG. 4), although not explicitly illustrated. In certain embodiments, the insulation material 214 may include silicon oxide, silicon nitride, silicon oxynitride, fluorine-doped silicate glass (FSG), low-k dielectric, combinations thereof, or other suitable materials. The deposition of the dielectric material can be carried out through various techniques, such as chemical vapor deposition (CVD), subatmospheric CVD (SACVD), flowable CVD (FCVD), atomic layer deposition (ALD), spin-on coating, or other suitable processes.

In some embodiments, to protect the sacrificial layers 206 from unintended etching, a silicon liner 2100 is conformally deposited over the fin-shaped structures 212 using ALD or CVD. In certain implementations, the silicon liner 2100 is epitaxially grown from the surfaces of the fin-shaped structures 212. In these implementations, the first layer 209 may be composed of silicon germanium, while the second layer 211 may be composed of silicon.

Figure 6A:
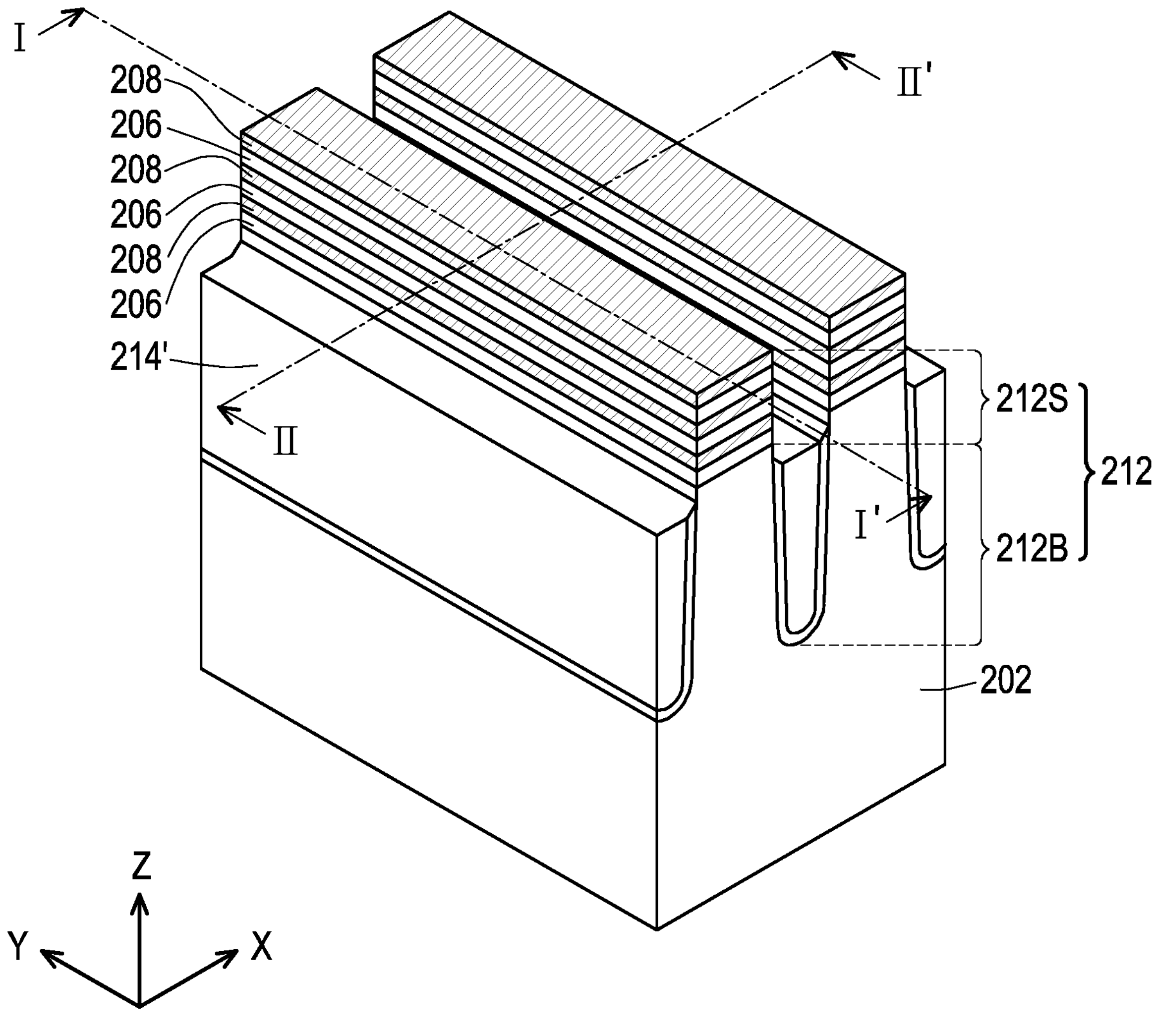
Figure 6C:
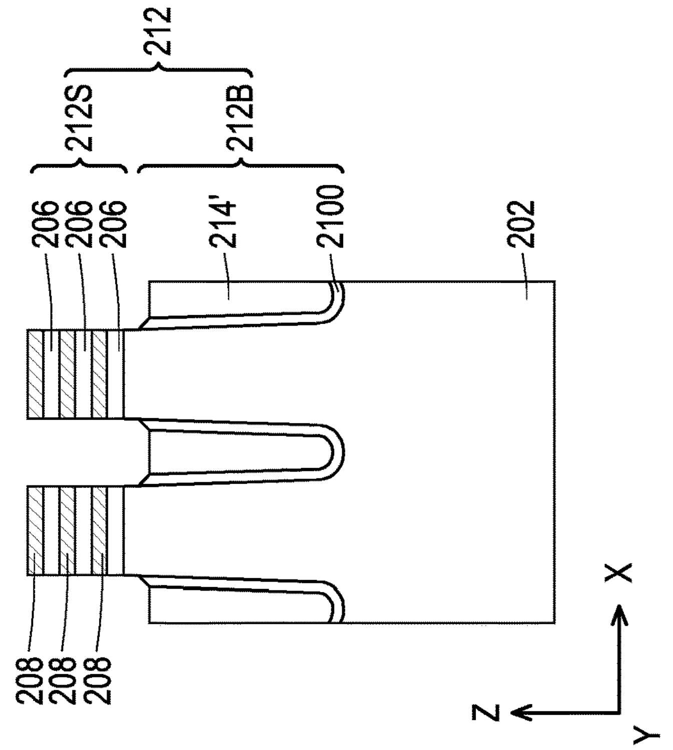
Figure 6B:
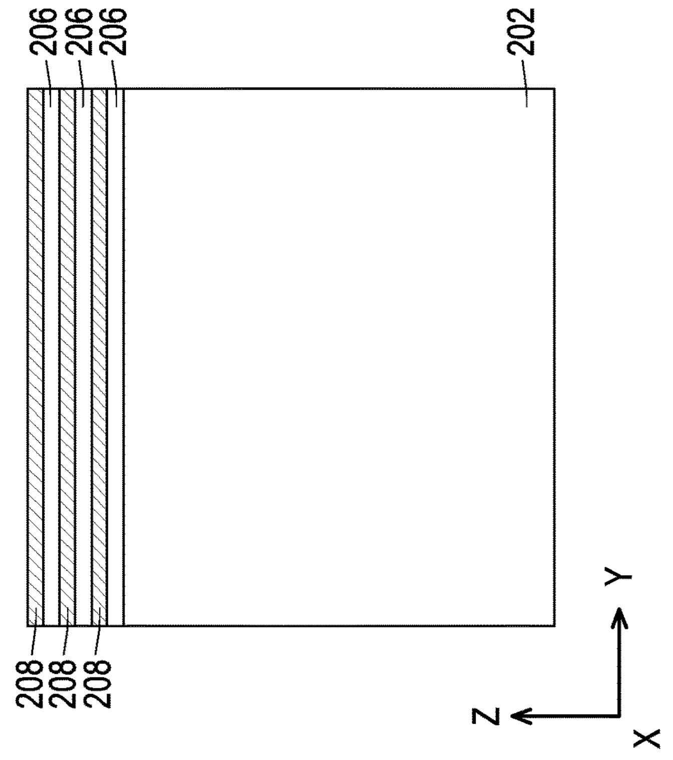

Referring to FIGS. 1 and 6A to 6C, method 100 includes a step 110 where a planarization process and a recessing process are performed on the insulation material 214. For instance, a chemical mechanical polishing (CMP) process is utilized to remove a portion of the insulation material 214 until the stack portions 212S are exposed. However, in alternative embodiments, the planarization can be carried out until the hard mask layer 210 is exposed. This means that a portion of the hard mask layer 210 might still remain even after the CMP process. The planarized dielectric material undergoes further recessing through a dry etching process, wet etching process, or a combination thereof, to form the isolation feature 214'. As depicted in FIGS. 6A to 6C, the stack portions 212S of the fin-shaped structures 212 extend above the isolation feature 214', while the base portions 212B are surrounded by the isolation feature 214'.

Figure 7:
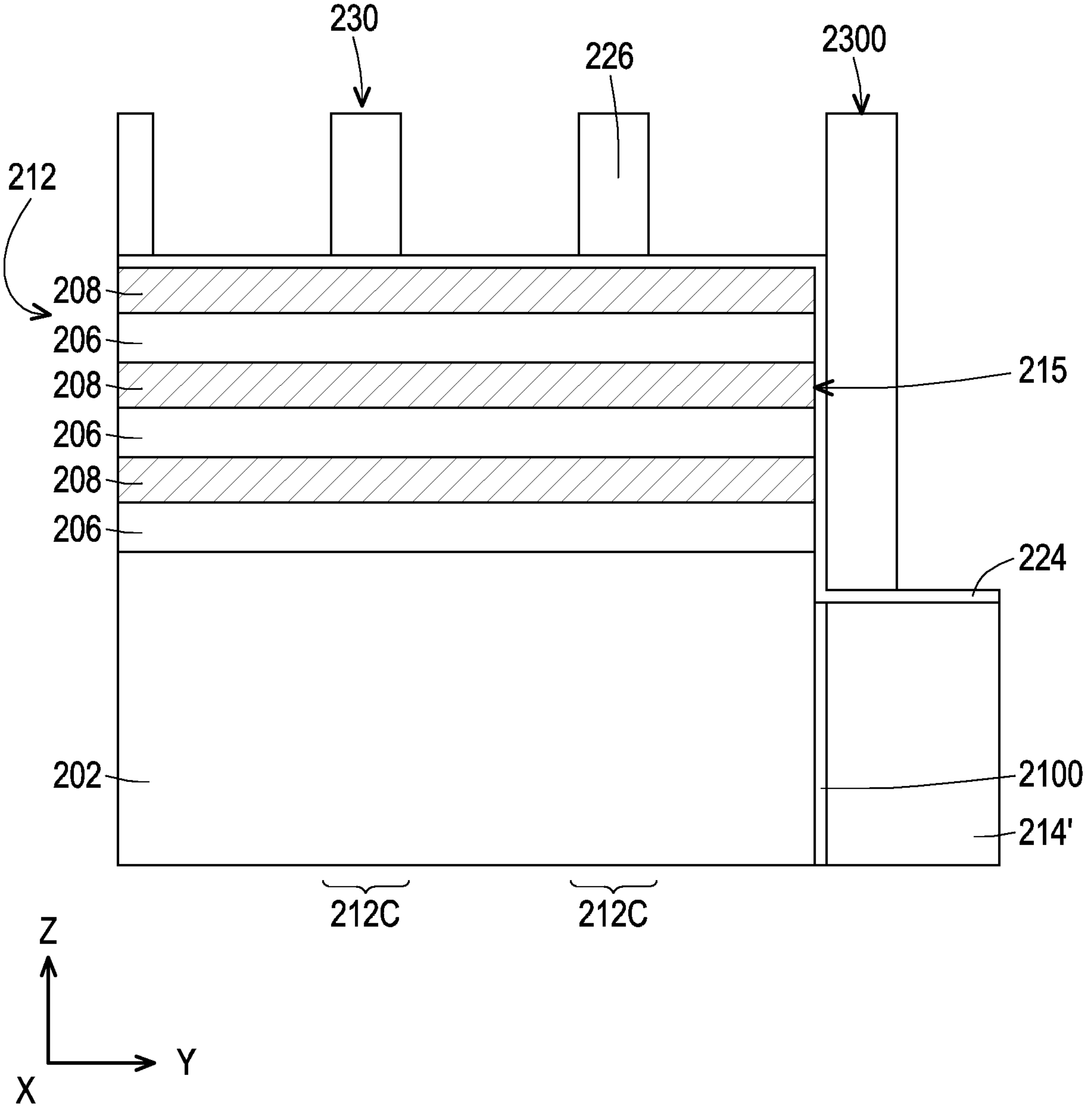

FIG. 7 to FIG. 16 depict the remaining process steps in the vicinity of the end sidewall 215, showing the cross-sectional structures. Referring to FIGS. 1 and 7, method 100 includes a step 112 where dummy gate stacks 230 are formed on top of the fin-shaped structures 212. In certain embodiments, a gate replacement process (or gate-last process) is utilized, where the dummy gate stacks 230 act as placeholders for functional gate structures. Various processes and configurations are feasible. As depicted in FIG. 7, each of the dummy gate stacks 230 consists of a dummy electrode 226 positioned over a dummy dielectric layer 224. The sections of the fin-shaped structures 212 beneath the dummy gate stacks 230 are referred to as channel regions 212C. In a typical process, the dummy dielectric layer 224 is uniformly deposited using chemical vapor deposition (CVD). Subsequently, a material layer for the dummy gate electrodes 226 is blanketly deposited over the dummy dielectric layer 224. To pattern the material layer into dummy electrodes 226, a gate top hard mask (not shown) is deposited over the material layer. The gate top hard mask may consist of multiple layers, such as a silicon nitride mask layer and a silicon oxide mask layer over the silicon nitride mask layer. Photolithography processes are employed to pattern the material layer and form the dummy electrodes 226. In certain embodiments, the dummy dielectric layer 224 may include silicon oxide, while the dummy electrodes 226 may include polycrystalline silicon (polysilicon). In the embodiments illustrated in FIG. 7, one of the dummy electrodes 226 is partially formed over the isolation feature 214' and the silicon liner 2100, and the one of the dummy electrodes 226 is deposited along the end sidewall 215 of the fin-shaped structure 212. For ease of reference, the dummy gate stacks 230 along the end sidewall 215 is referred to as the end dummy gate stack 2300. As shown in FIG. 7, the end dummy gate stack 2300 includes a dummy dielectric layer 224 that extends from the top surface of the fin-shaped structure 212 along the end sidewall 215 to the isolation feature 214', as well as one of the dummy electrodes 226 positioned above the isolation feature 214'.

Although not explicitly shown in FIG. 7, portions of the dummy dielectric layer 224 that is not protected by the dummy electrodes 226 may be anisotropically etched and removed. As a result, each of the dummy gate stacks 230 includes the dummy dielectric layer 224 and a dummy electrode 226 over the dummy dielectric layer 224.

Figure 8:
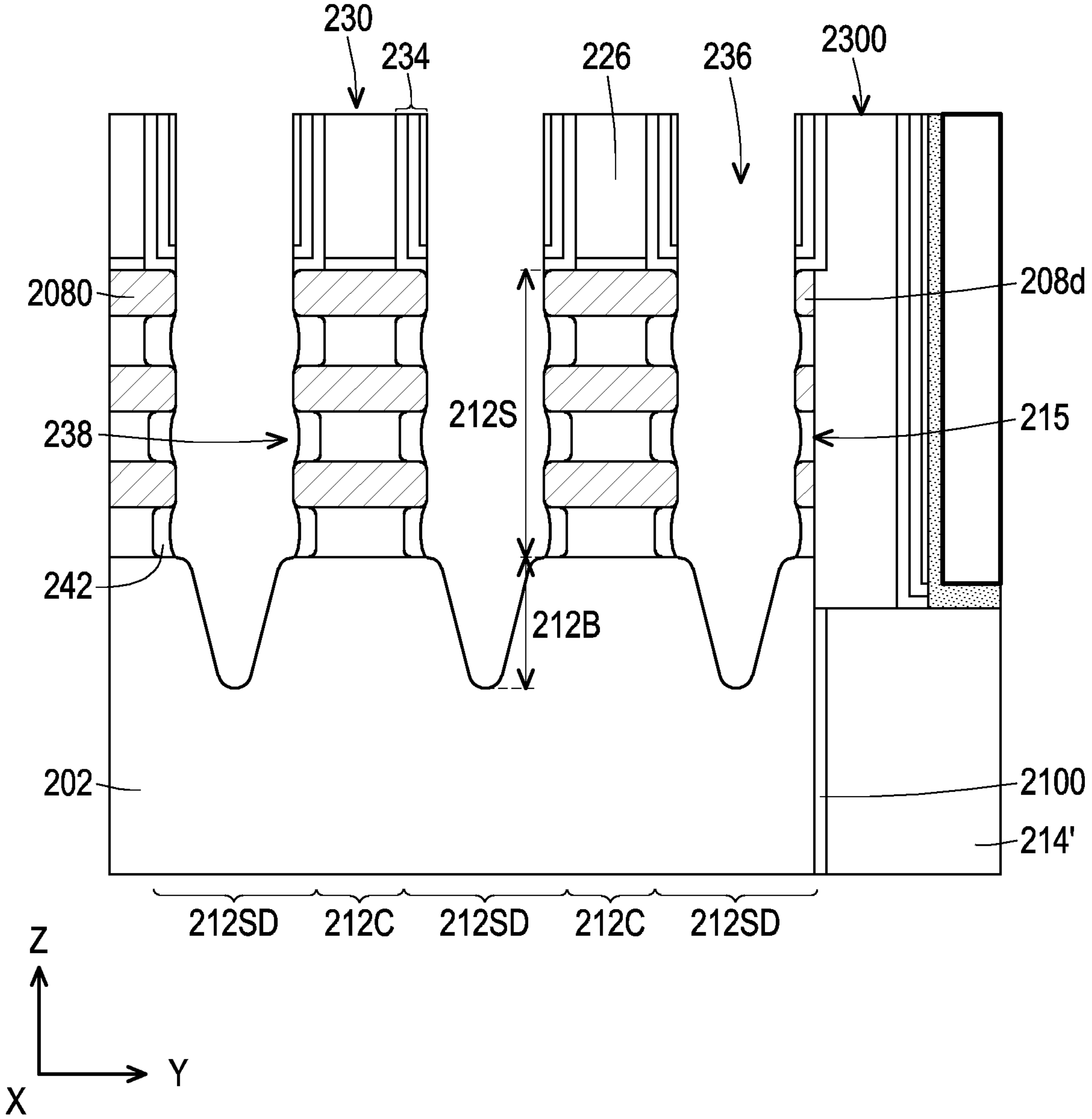

Referring to FIGS. 1 and 8, method 100 includes a step 114 where gate spacers 234 are formed along the sidewalls of the dummy gate stacks 230. Each of the gate spacers 234 may consist of two or more gate spacer layers. The dielectric materials chosen for the gate spacers 234 are capable of selectively removing the dummy gate stacks 230. Suitable dielectric materials for the gate spacers 234 include silicon nitride, silicon oxycarbonitride, silicon carbonitride, silicon oxide, silicon oxycarbide, silicon carbide, silicon oxynitride, or combinations thereof, or other low-k dielectric material. The gate spacers 234 are conformally deposited on the dummy gate stacks 230 using chemical vapor deposition (CVD), subatmospheric CVD (SACVD), or atomic layer deposition (ALD). In this embodiment, one of the gate spacers 234 on the end dummy gate stack 2300 extends to the isolation feature 214'. A portion of the one of the gate spacers 234 above the isolation feature 214' has a higher height compared to other gate spacers 234 above the fin-shaped structure 212.

Still referring to FIGS. 1 and 8, method 100 further includes a step 116 where the source/drain regions 212SD are recessed to create source/drain trenches 236. Using the dummy gate stacks 230 and the gate spacers 234 as etch masks, anisotropic etching is performed to form the source/drain trenches 236 above the source/drain regions 212SD. In certain embodiments, as shown in FIG. 8, a significant portion of the stack portions 212S of the fin-shaped structures 212 within the source/drain regions 212SD may be removed, and the source/drain trenches 236 may extend into the base portions 212B, which are formed from the substrate 202. The anisotropic etching process in step 116 may involve dry etching or an appropriate etching method. For instance, the dry etching process may utilize an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, or combinations thereof.

Due to the protection provided by the end dummy gate stack 2300 and the gate spacers 234, a portion of the channel layers 208 at the end surface 215 is retained after the anisotropic etching process. This preserved portion of the channel layers 208, which is closest to the end surface 215, can also be referred to as the dummy channel structure 208*d*.

The channel regions 212C of the fin-shaped structures 212 are positioned beneath the dummy gate stacks 230. Each channel region 212C is sandwiched between corresponding two source/drain regions 212SD.

In some embodiments, the sacrificial layers 206 exposed in the source/drain trenches 236 are selectively and partially recessed to create inner spacer recesses 238, while the exposed channel layers 208 remain mostly unetched. In an embodiment where the channel layers 208 primarily consist of silicon (Si) and the sacrificial layers 206 primarily consist of silicon germanium (SiGe), the selective and partial recess of the sacrificial layers 206 may involve a SiGe oxidation process followed by the removal of SiGe oxide. In such embodiments, the SiGe oxidation process may utilize ozone. Alternatively, in other embodiments, the selective recess may employ a selective isotropic etching process, such as selective dry etching or selective wet etching, where the extent of recessing the sacrificial layers 206 is controlled by the duration of the etching process. The selective dry etching process may involve the use of one or more fluorine-based etchants, such as fluorine gas or hydrofluorocarbons. The selective wet etching process may employ a hydrofluoric acid (HF) or ammonium hydroxide ($NH_4OH$) etchant.

Figure 9:
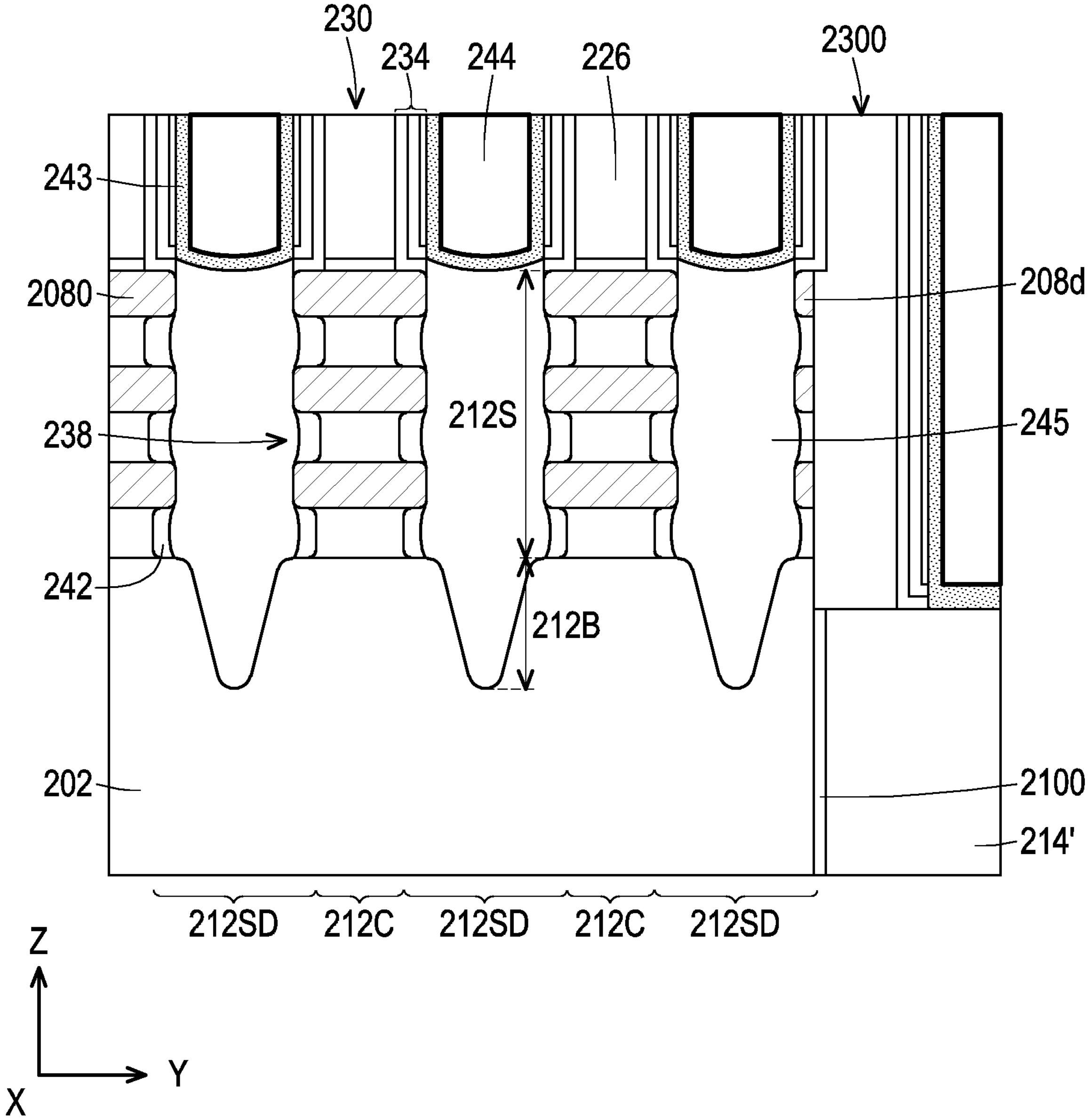

An inner spacer material layer is conformally deposited over the workpiece, including inside the inner spacer recesses 238, using chemical vapor deposition (CVD) or atomic layer deposition (ALD). The inner spacer material may comprise silicon nitride, silicon oxycarbonitride, silicon carbonitride, silicon oxide, silicon oxycarbide, silicon carbide, or silico oxynitride. Following the deposition of the inner spacer material layer, it is etched back to form inner spacer features 242, as shown in FIG. 9. In certain embodiments, the inner spacer material may also be deposited on the bottom surfaces of the source/drain trenches 236 and may remain intact after the etch-back process, forming a bottom feature (not shown in FIG. 9). As both the bottom feature and the inner spacer features 242 are composed of the same inner spacer material, they naturally share the same composition.

Referring to FIGS. 1 and 9, method 100 includes a step 118 where source/drain features 245 are formed within the source/drain trenches 236. The source/drain features 245 can be deposited through various epitaxial processes such as vapor-phase epitaxy (VPE), ultra-high vacuum chemical vapor deposition (UHV-CVD), molecular beam epitaxy (MBE), or other suitable methods. These source/drain features 245 can be either n-type or p-type. In the case of n-type source/drain features 245, the source/drain features 245 may include silicon (Si) and be doped with an n-type dopant like phosphorus (P) or arsenic (As). Conversely, for p-type source/drain features 245, the source/drain features 245 may consist of silicon germanium (SiGe) or germanium (Ge) and be doped with a p-type dopant like boron (B) or gallium (Ga). Doping of the source/drain features 245 can be performed either in situ during their deposition or ex-situ using an implantation process like junction implant process.

Referring to FIGS. 1 and 9, method 100 includes a step 120 where a contact etching stop layer (CESL) 243 and an interlayer dielectric (ILD) layer 244 are deposited. In an example process, the CESL 243 is first conformally deposited on the gate spacers 234, the source/drain features 245 and the isolation feature 214', then the ILD layer 244 is blanketly deposited on the CESL 243. The CESL 243 may include silicon nitride, silicon oxide, silicon oxynitride, and/or other materials known in the art. The CESL 243 may be deposited using ALD, plasma-enhanced chemical vapor deposition (PECVD) process and/or other suitable deposition or oxidation processes. In some embodiments, the ILD layer 244 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be deposited by spin-on coating, an FCVD process, or other suitable deposition technique. In some embodiments, after formation of the ILD layer 244, the workpiece may be annealed to improve integrity of the ILD layer 244. To remove excess materials and to expose top surfaces of the dummy electrodes 226 of the dummy gate stacks 230, a planarization process (such a chemical mechanical polishing (CMP) process) may be performed to the workpiece to provide a planar top surface, as illustrated in FIG. 9. Top surfaces of the dummy electrodes 226 are exposed on the planar top surface.

Figure 10:
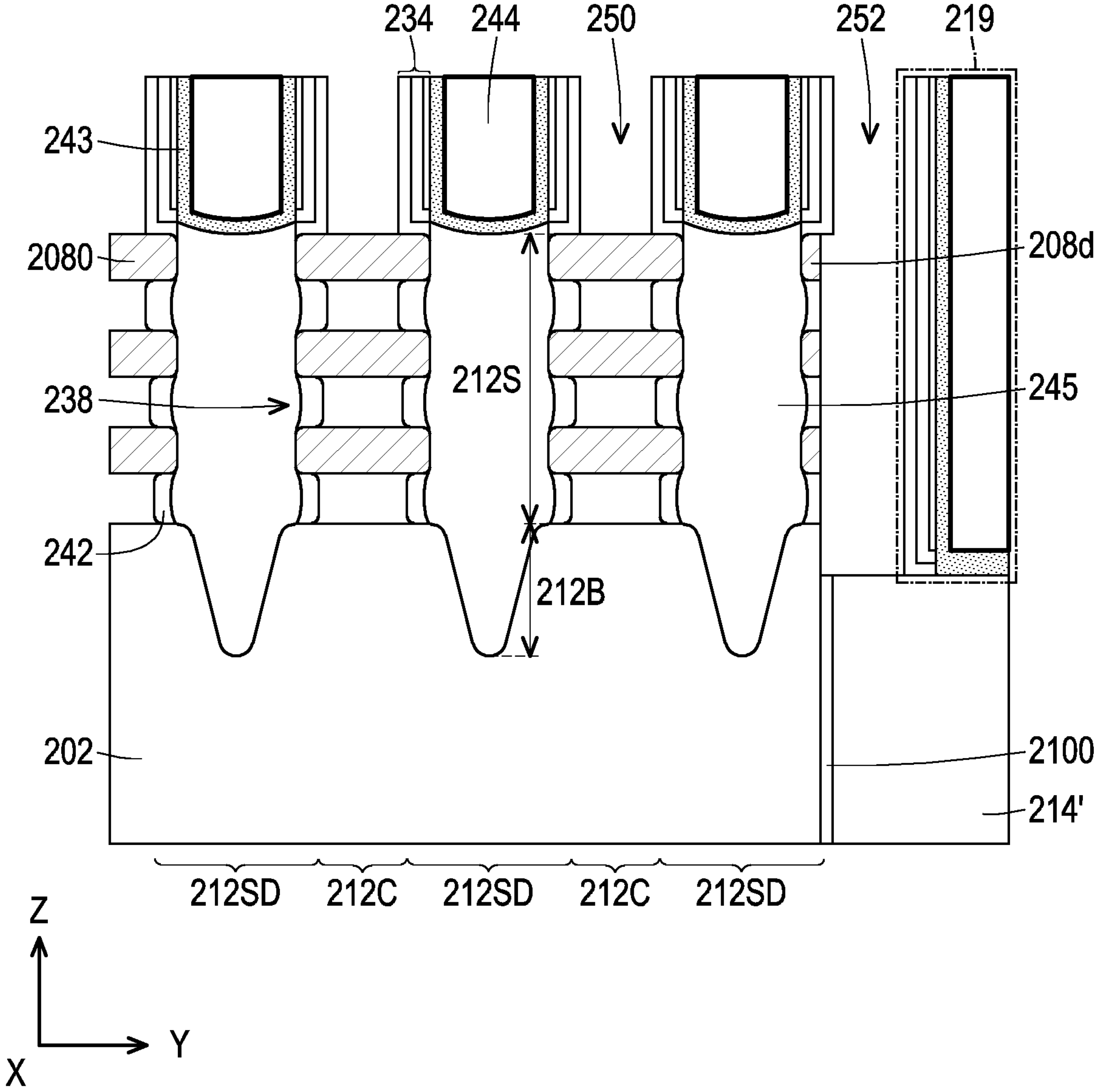

Referring to FIGS. 1 and 10, method 100 includes a step 122 where the removal of the dummy gate stacks 230 and the release of the channel members 2080 take place. The channel members 2080 can also be referred to as a gate-all-around (GAA) structure. At step 122, the dummy gate stacks 230 that were exposed during the previous operation at step 120 are removed. This removal creates gate trenches 250 above the channel regions 212C. The elimination of the dummy gate stacks 230 can involve one or more etching processes that selectively target the material in the dummy gate stacks 230. For instance, selective wet etching, selective dry etching, or a combination of both can be used to remove the dummy gate stacks 230. Once the dummy gate stacks 230 are removed, the sidewalls of the channel layers 208 and sacrificial layers 206 in the channel regions 212C become exposed within the gate trenches 250. The sacrificial layers 206 between the channel layers 208 in the channel regions 212C, which are now exposed, can be selectively removed to release the channel layers 208, forming channel members 2080. The channel members 2080 are vertically stacked along the Z direction. Selective removal of the sacrificial layers 206 can be achieved through selective dry etching, selective wet etching, or other selective etching processes. In certain embodiments, selective wet etching may involve an APM etch (ammonia hydroxide-hydrogen peroxide-water mixture). In alternative embodiments, the selective removal process may include silicon germanium oxidation followed by the removal of silicon germanium oxide. For example, oxidation can be performed using an ozone clean, followed by the removal of silicon germanium oxide using an etchant like $NH_4OH$. In this embodiment, the end dummy gate stack 2300 is also removed during step 122. As depicted in FIG. 10, the removal of the end dummy gate stack 2300 results in the formation of an end trench 252. The inner spacer features 242, the isolation feature 214', the dummy channel structure **208*d* and the silicon liner 2100 are exposed within the end trench 252**.

The channel members 2080 of each transistor are located between and electrically connected with two corresponding source/drain feature 245.

Referring to FIG. 10, at least one of the gate spacers 234, the CESL 243 and the ILD layer 244 deposited over the fin cut opening 213 (referring to FIG. 4) may collectively constitute an isolation structure 219 that is disposed over the isolation feature 214'.

Figure 11:
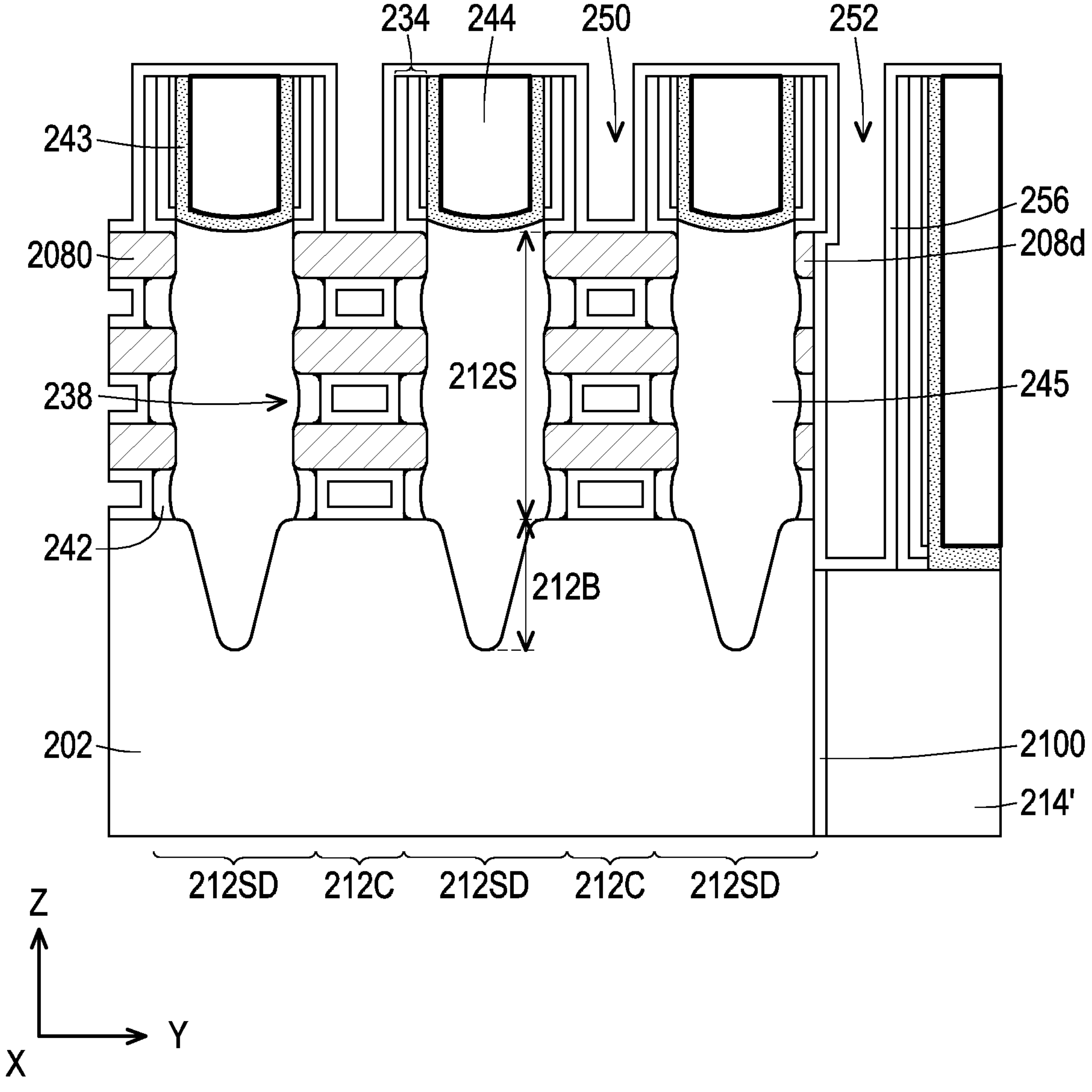

Referring to FIGS. 1 and 11, method 100 includes a step 124 where a gate dielectric layer 256 is deposited in the gate trenches 250 and the end trench 252. In certain embodiments, an interfacial layer (not shown) consists of silicon oxide may be formed on the channel members 2080 before forming the gate dielectric layer 256. The interfacial layer may be formed through a pre-clean process. The pre-clean process oxidizes the exposed surfaces of the channel members 2080, resulting in the formation of the interfacial layer. The gate dielectric layer 256 is then deposited in the gate trenches 250 using ALD, CVD, or other suitable methods. The gate dielectric layer 256 may consist of high-K dielectric materials, which are dielectric materials with a high dielectric constant, exceeding that of thermal silicon oxide (approximately 3.9). Hafnium oxide is an example of a high-K dielectric material that can be included in the gate dielectric layer 256. Alternatively, the gate dielectric layer 256 may comprise other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable materials.

Figure 12:
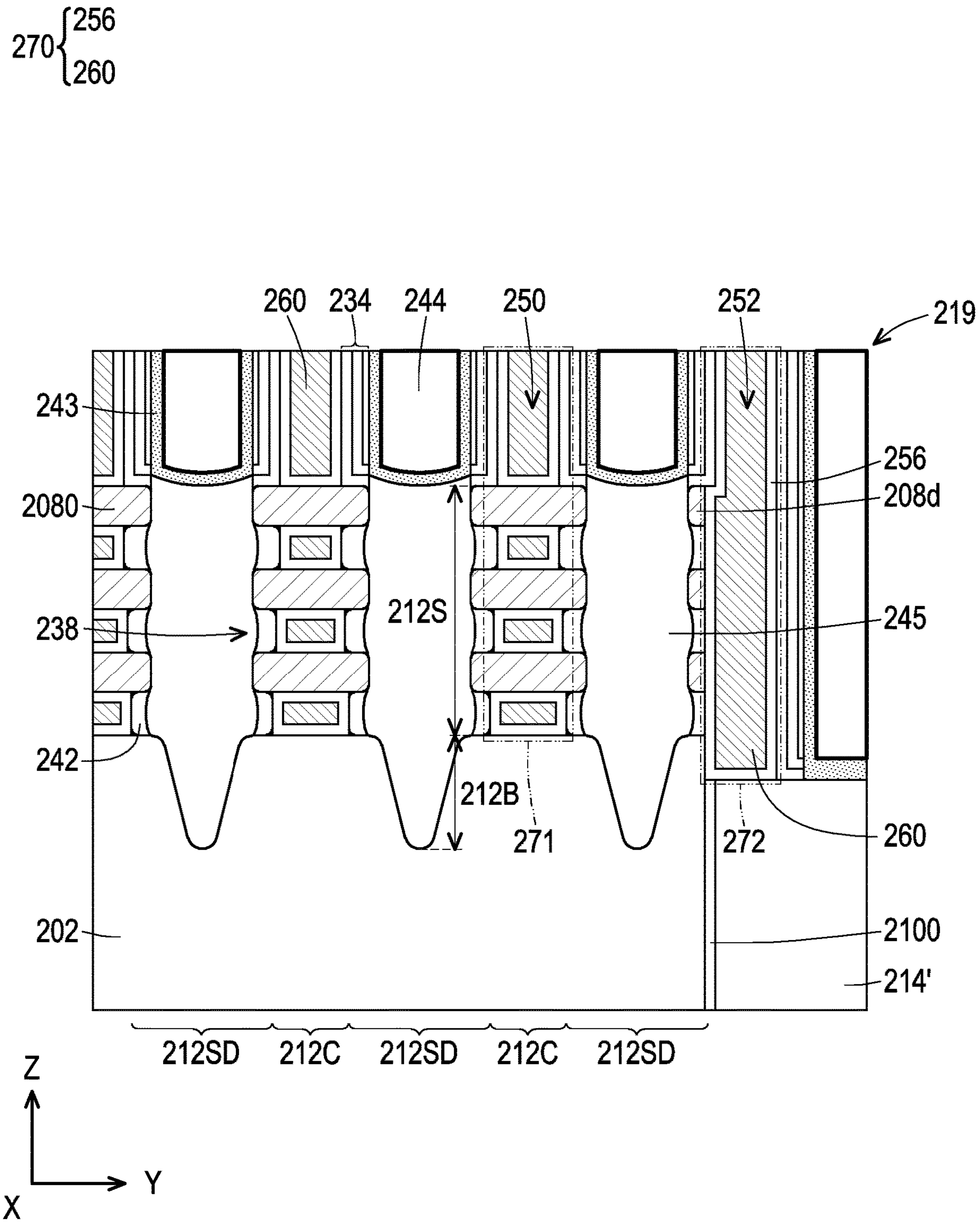

Referring to FIGS. 1 and 12, method 100 includes a step 126 where gate electrodes 260 are deposited. The gate electrodes 260 are deposited within the gate trenches 250 and the end trench 252. The gate electrodes 260 can be a multi-layer structure consisting of at least one work function layer and a metal fill layer. For instance, the work function layer may include materials such as titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). On the other hand, the metal fill layer may comprise aluminum (Al), tungsten (W), nickel (Ni), titanium (Ti), ruthenium (Ru), cobalt (Co), platinum (Pt), tantalum silicon nitride (TaSiN), copper (Cu), other refractory metals, suitable metal materials, or a combination thereof. The gate electrodes 260 can be formed using various methods, including ALD, PVD, CVD, e-beam evaporation, or other suitable processes. Furthermore, a planarization process like CMP may be performed to eliminate excess materials and achieve a substantially flat top surface for the gate electrodes. The gate dielectric layer 256 is disposed between the channel members 2080 and the gate electrodes 260.

Referring to FIG. 12, steps 124 and 126 are responsible for forming gate structures 270 that wrap around the channel members 2080 in channel regions 212C. In certain embodiments depicted in FIG. 12, each gate structure 270 includes the gate dielectric layer 256 and the gate electrode 260. Each gate structure 270 wraps around the channel members 2080 and located between a pair of gate spacers 234.

In this embodiment, at least one of the gate structures 270 includes a main body 271 filled in the gate trench 250 and a gate extension structure 272 filled in the end trench 252. For example, the end trench 252 is connected to other gate trench 250 in the X direction, allowing the gate extension structure 272 within the end trench 252 to connect to a corresponding main body 271 in the X direction (not shown in FIG. 12). In some embodiments, a portion of the gate structures 270 does not include the gate extension structure 272 that is filled into the end trench 252. In other words, some of the transistors have the gate extension structure 272, while others do not have the gate extension structure 272.

The gate extension structure 272 is designed to establish electrical connectivity with the adjacent source/drain feature 245 through a subsequently formed butted contact. The gate extension structure 272 is positioned between the adjacent source/drain feature 245 and the isolation structure 219, making direct contact with the inner spacer features 242 and the dummy channel structure **208*d* that are in contact with the adjacent source/drain feature 245. The dummy channel structure 208*d* is laterally located between the gate extension structure 272 of the gate structure 270 and the adjacent source/drain feature 245**.

Figure 13:
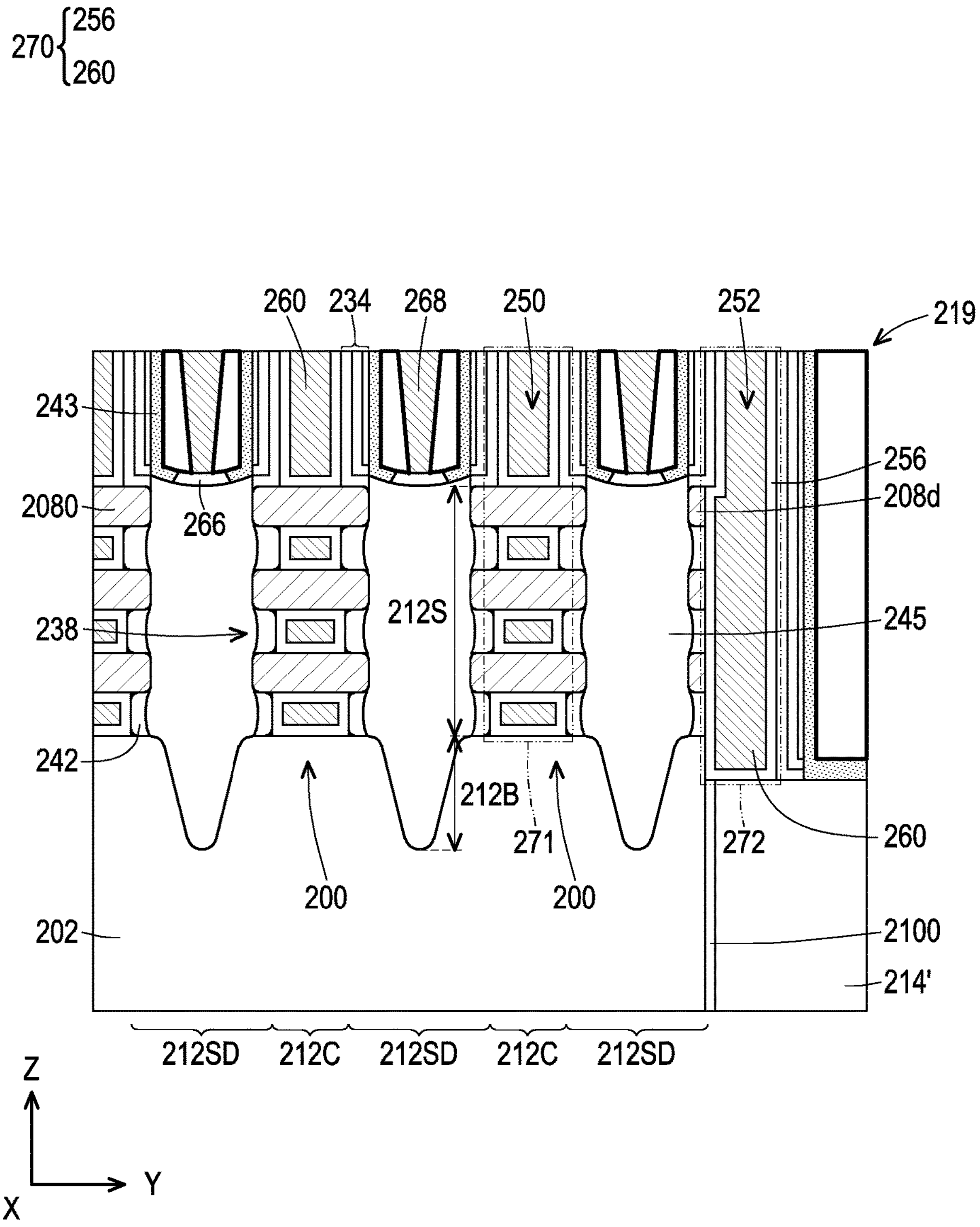

Referring to FIGS. 1 and 13, after completing the operations at step 126, step 128 can be carried out to finalize the fabrication of the transistors 200. These processes may involve the formation of source/drain contacts 268. As for the source/drain contacts 268, it can be formed by incorporating a barrier layer and a metal plug. The barrier layer may comprise materials like titanium nitride, tantalum nitride, cobalt nitride, nickel nitride, or other metal nitrides, while the metal plug may include aluminum (Al), tungsten (W), nickel (Ni), titanium (Ti), ruthenium (Ru), cobalt (Co), platinum (Pt), or copper (Cu).

The source/drain contacts 268 are embedded in the interlayer dielectric layer 244 and are respectively electrically connected to the underlying source/drain features 245. In some embodiments, a silicide layer 266 may be formed between the source/drain contacts 268 and the source/drain features 245. The silicide layer 266 is consist of titanium silicide (TiSi), titanium silicon nitride (TiSiN), tantalum silicide (TaSi), tungsten silicide (WSi), cobalt silicide (CoSi), or nickel silicide (NiSi).

In this embodiment, a CMP process is used to remove the excess portion of the source/drain contacts 268 beyond the interlayer dielectric layer 244, resulting in a top surfaces of the interlayer dielectric layer 244 and the gate structures 270 being coplanar with the top surface of the source/drain contacts 268. In some alternately embodiments, a recess process can be performed on the gate structures 270, causing the top surface of the gate structures 270 to be recessed or lowered. Subsequently, a capping layer and a self-aligned-contact (SAC) dielectric layer can be formed on the gate structures 270. In this scenario, the top surface of the gate structures 270 will be lower than the top surface of the source/drain contacts 268.

In some embodiments, a recess process can be performed on the source/drain contacts 268, causing the top surface of the source/drain contacts 268 to be recessed or lowered. Subsequently, a capping layer and a self-aligned-contact (SAC) dielectric layer can be formed on the source/drain contacts 268. In this scenario, the top surface of the source/drain contacts 268 will be lower than the top surface of the gate structures 270.

Figure 14:
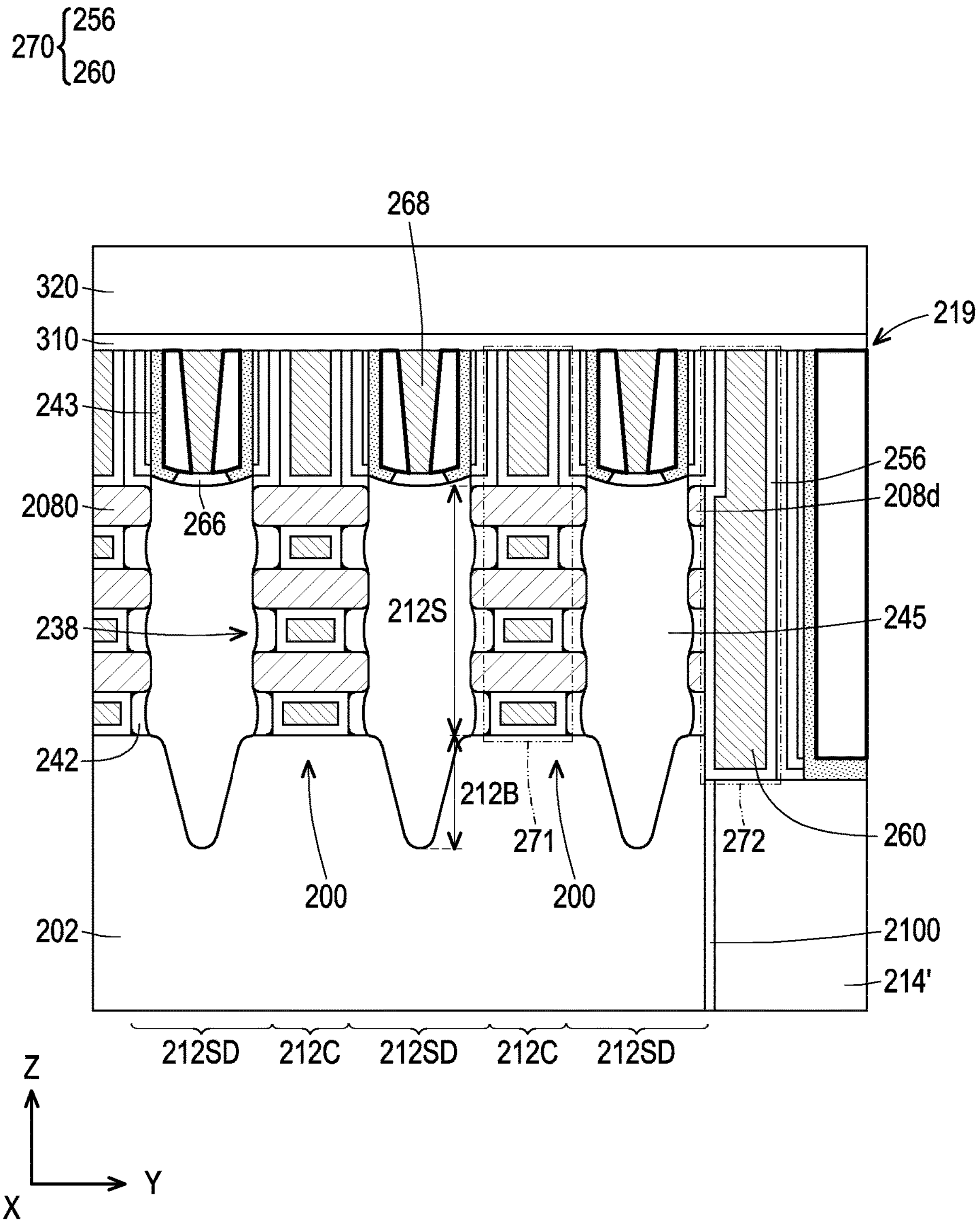

Next, referring to FIGS. 1 and 14 to 16, at step 130, an interconnect structure 300 is formed over the transistors 200. First, as shown in FIG. 14, a protective layer 310 is blanketly deposited over the source/drain contacts 268, the gate structures 270, the CESL 243, the gate spacers 234, and the ILD layer 244. An insulation layer 320 is then blanket deposited over the protective layer 310. The protective layer 310 may be an etching stop layer, and may include silicon nitride, silicon oxide, silicon oxynitride, and/or other materials known in the art. The protective layer 310 may be deposited using ALD, plasma-enhanced chemical vapor deposition (PECVD) process and/or other suitable deposition or oxidation processes. In some embodiments, the insulation layer 320 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The insulation layer 320 may be deposited by spin-on coating, an FCVD process, or other suitable deposition technique.

Figure 15:
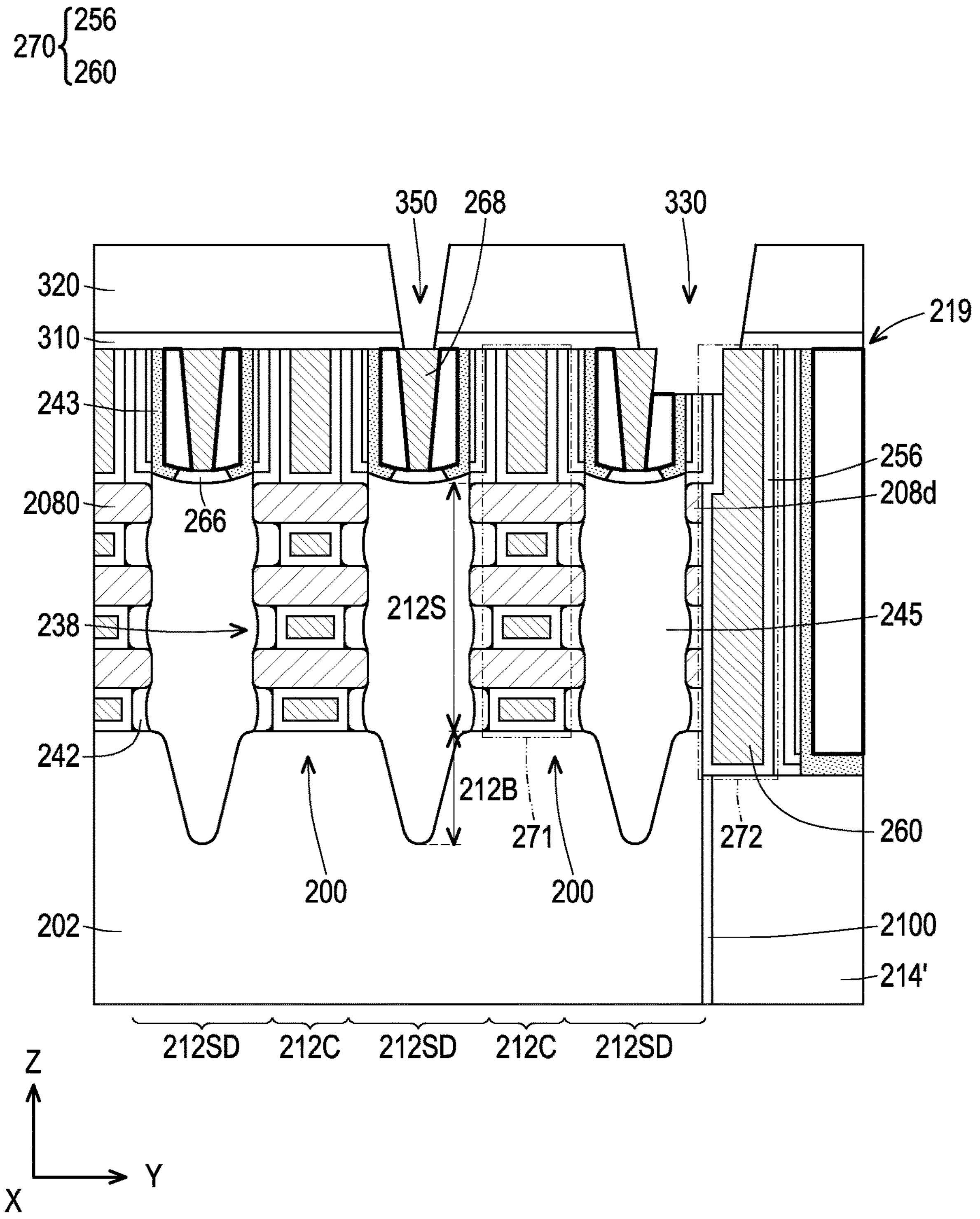

Referring to FIG. 15, a removal process is performed to create an opening 330, exposing the gate extension structure 272 and the adjacent source/drain contact 268. In some embodiments, the removal process includes wet etching or other suitable techniques. In certain embodiments, the removal process not only removes a portion of the insulation layer 320 and a portion of the protective layer 310 but also utilizes pull-back etching to remove the insulating material (including the CESL 243, the gate spacer 234 and the gate dielectric layer 256) laterally between the gate electrode 260 of the extension structure 272 and the adjacent source/drain contact 268. That is, the opening 330 extends between the gate extension structure 272 and the source/drain contact 268, exposing partial sidewalls of the gate electrode 260 of the gate extension structure 272 and partial sidewalls of the source/drain contact 268. In some embodiments, the removal process involves using one or more etchants in the same etch chamber to remove different materials of the insulating layers.

In some embodiments, the gate dielectric layer 256 at the sidewall of the gate extension structure 272 near the opening 330 will be partially removed, causing the height of the gate dielectric layer 256 at the sidewall of the gate extension structure 272 near the opening 330 to be lower than the height of the gate dielectric layer 256 at the sidewall of the gate extension structure 272 facing away from the opening 330. The opening 330 exposes a part of the top surface and a part of the sidewall of the gate electrode 260 of the gate extension structure 272, as well as a part of the top surface and a part of the sidewall of the source/drain contact 268.

Figure 16:
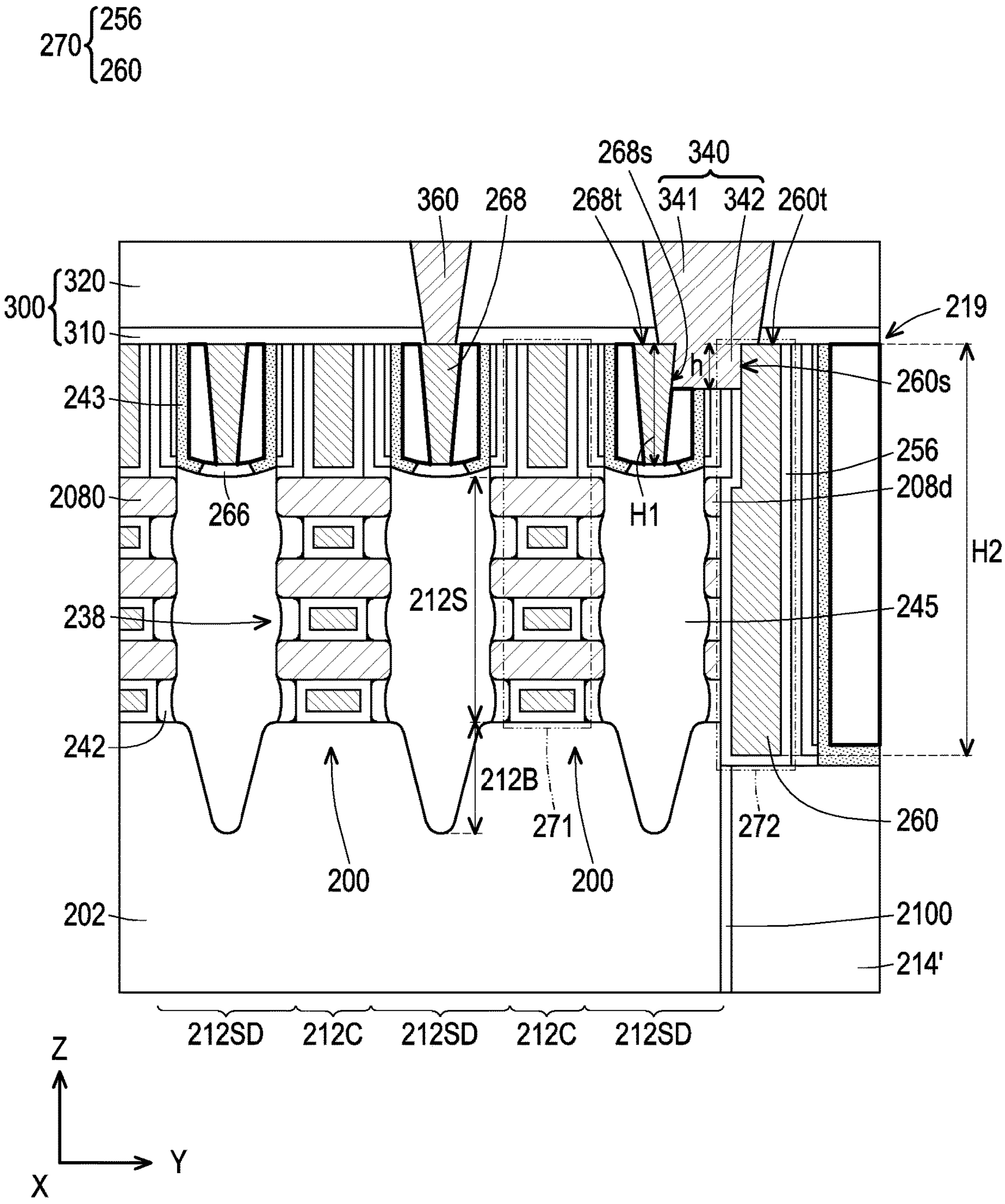

Referring to FIG. 16, a conductive via 340 (also referred to as the butted contact) is formed in the opening 330, and one of the gate spacers 234 is located underneath the conductive via 340. The conductive via 340 can be formed by incorporating a barrier layer and a metal plug. The barrier layer may comprise materials like titanium nitride, tantalum nitride, cobalt nitride, nickel nitride, or other metal nitrides, while the metal plug may include aluminum (Al), tungsten (W), nickel (Ni), titanium (Ti), ruthenium (Ru), cobalt (Co), platinum (Pt), or copper (Cu). The process for the formation of the conductive via 340 may include a CVD technique, a PVD technique, an ALD technique, an electroplating technique, or other suitable deposition technique. After the deposition of the metal material of the conductive via 340, a planarization process such as chemical mechanical polishing (CMP) can be performed to achieve a flat top surface for the conductive via 340.

The conductive via 340 is electrically connecting the source/drain contact 268 to the gate structure 270, and in contact with the top surface 260*t* and the sidewall 260*s* of the gate electrode 260 of the gate extension structure 272 and the top surface 268*t* and the sidewall 268*s* of the source/drain contact 268. The conductive via 340 is extending from a portion of the top surface 268*t* and a portion of the top surface 260*t* to between the sidewall 260*s* and the sidewall 268*s*. In some embodiments, the conductive via 340 extends from a top surface of the interlayer dielectric layer 244 into the interlayer dielectric layer 244.

In this embodiment, the conductive via 340 includes an upper portion 341, penetrating through the insulation layer 320 and the protective layer 310, and a bottom portion 342, laterally located between the gate electrode 260 and the source/drain contact 268. The width of the bottom portion 342 is less than the width of the upper portion 341. In some embodiments, the upper portion 341 covers ⅓ to 2/1 of the top surface 268*t* of the source/drain contact 268 and ⅓ to 2/1 of the top surface 260*t* of the gate electrode 260. In this embodiment, the design of the conductive via 340 allows for a reduction in resistance between the source/drain contact 268 and the gate structure 270, thereby improving the transistor's performance. Additionally, even with small top surfaces of the source/drain contact 268 and the gate structure 270, the design of the bottom portion 342 ensures proper contact between them. As a result, even as the size of the transistor decreases, there is sufficient electrical connectivity between the source/drain contact 268 and the gate structure 270.

Figure 21:
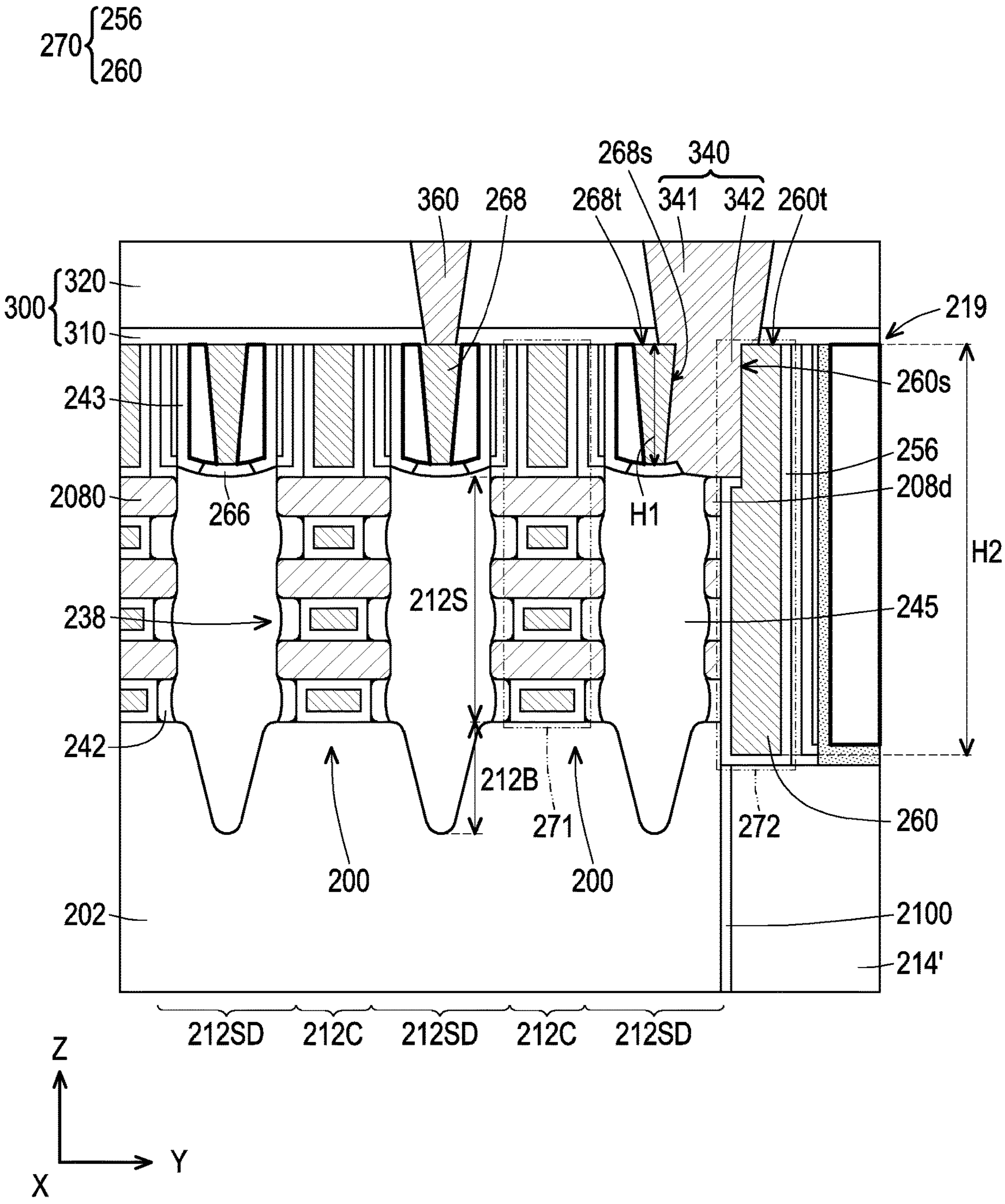
FIG. 21 illustrates a cross-section schematic diagram of a semiconductor device, according to still another embodiment of the present disclosure.

In this embodiment, the gate spacer 234 in contact with and located underlying the conductive via 340 is shorter than another gate spacer 234 located between the gate electrode 260 in the gate trench 250 (i.e. the main body 271 of the gate structure 270) and the adjacent source/drain contact 268. In some embodiments, the pull-back etching in FIG. 15 extends the opening 330 about 5 nm below the bottom surface of the protective layer 310. As a result, the height h of the bottom portion 342, which is filled between the gate electrode 260 and the source/drain contact 268, is about 5 nm. In this embodiment, a portion of the gate spacer 234 is retained between the conductive via 340 and the dummy channel structure 208*d*, such that the conductive via 340 is separated from the dummy channel structure 208*d*. In other embodiments, the gate spacer 234 between the conductive via 340 and the dummy channel structure 208*d* is removed, allowing direct contact between the conductive via 340 and the dummy channel structure 208*d*, as shown in FIG. 21.

In some embodiments, the height H1 of the source/drain contacts 268 is within a range of 10 nm to 80 nm, and the height H2 of the gate structures 270 is within a range of 10 nm to 80 nm. When the height H1 of the source/drain contacts 268 is greater than the height H2 of the gate structures 270, the top surface of the source/drain contacts 268 may be higher than the top surface of the gate structures 270. In other words, a portion of the source/drain contacts 268 may be disposed in the interconnect structure 300.

In some embodiments, while forming the conductive via 340 to connect the gate extension structure 272 to the adjacent source/drain contact 268, one or more conductive via(s) 360 can also be formed simultaneously to connect other source/drain contacts 268 and/or other gate structures 270 to corresponding signal lines. For example, during the formation of the opening 330 in FIG. 15, an additional opening 350 exposing other metal feature (such as other source/drain contact 268) can be formed. Subsequently, during the formation of the conductive via 340 in FIG. 16, the conductive material can be filled in both the opening 330 and the opening 350 to form the conductive via 340 and the conductive via 360. In FIG. 15 to FIG. 16, the example is shown with the conductive via 360 connecting the other source/drain contact 268, but it should be understood that the present disclosure is not limited to this. In other embodiments, the conductive via 360 can connect the other gate structure 270 or multiple conductive vias 360 can be formed to respectively connect other source/drain contacts 268 and other gate structures 270.

In this embodiment, the conductive via 340 and the conductive via 360 are formed using the same deposition process of conductive material, and their top surfaces are coplanar. In alternative embodiments, the conductive via 340 and the conductive via 360 may be formed in different deposition processes, and their top surfaces may not be coplanar.

By using the gate extension structure 272 to electrically couple to a source/drain feature 245 shown in FIG. 16, embodiments of the present disclosure may be applied to connect a gate structure of one transistor to a source/drain feature of another transistor. An example of such an application is described in conjunction with FIGS. 22 and 23.

Figure 17:
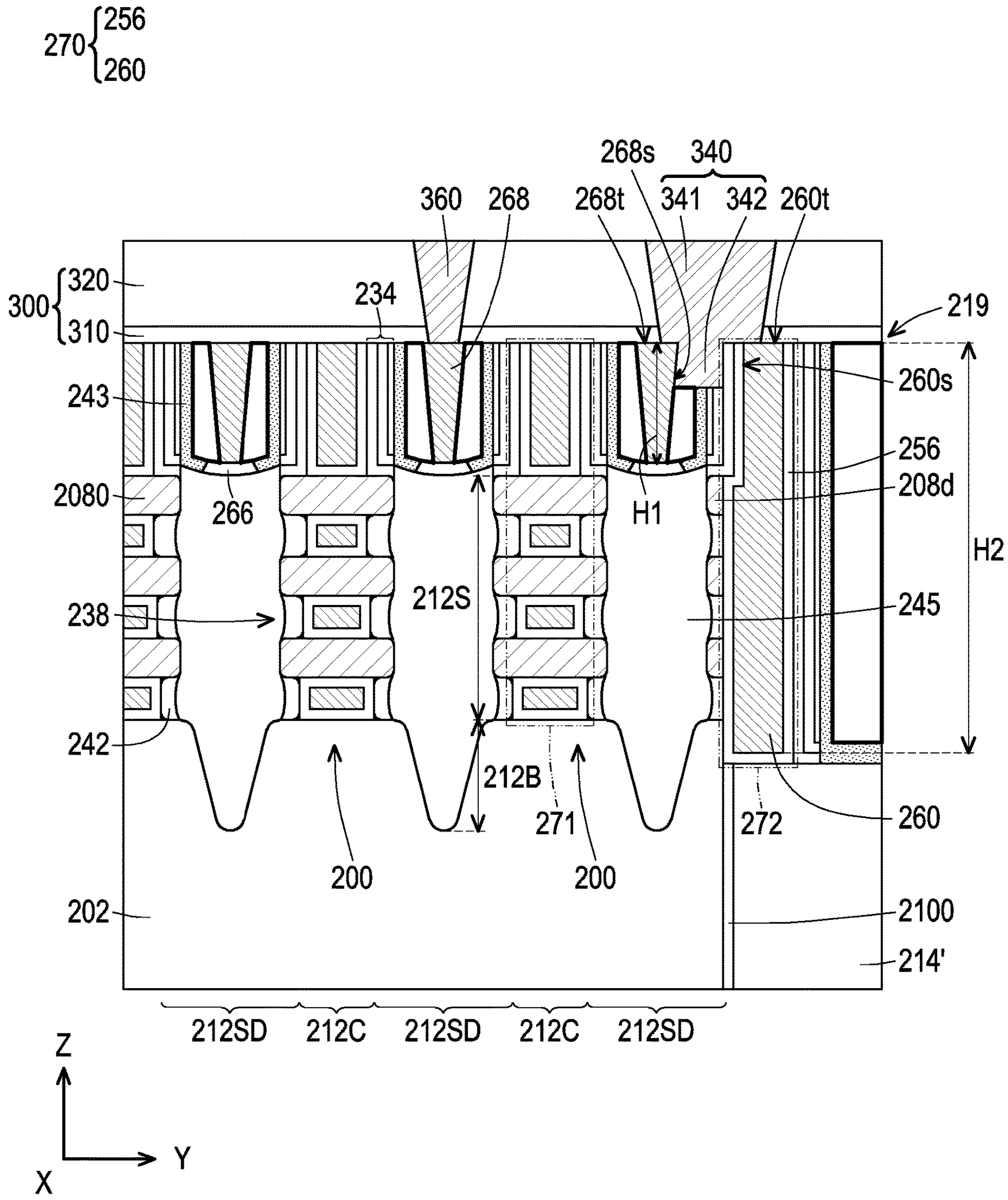
FIG. 17 illustrates a cross-section schematic diagram of a semiconductor device, according to another embodiment of the present disclosure.

FIG. 17 illustrates a cross-section schematic diagram of a semiconductor device, according to another embodiment of the present disclosure. It should be noted herein that, in the embodiment provided in FIG. 17, element numerals and partial content of the embodiments provided in FIG. 2 to FIG. 16 are followed, the same or similar reference numerals being used to represent the same or similar elements, and description of the same technical content being omitted. For a description of an omitted part, reference may be made to the foregoing embodiment, and the descriptions thereof are omitted herein.

In the embodiment shown in FIG. 17, the conductive via 340 does not directly contact the side surface 260*s* of the gate electrodes 260. Instead, there are the gate dielectric layer 256 and the gate spacer 234 sandwiched between the conductive via 340 and the side surface of the gate electrodes 260. A portion of the conductive via 340 is in contact with and located between the gate spacer 234 and the source/drain contact 268. A portion of the gate spacer 234 laterally between the conductive via 340 and the gate electrode 260 may be partially removed during the pull-back etching (as shown in step in FIG. 15), resulting in a thinner thickness of the gate spacer 234 laterally between the conductive via 340 and the gate electrode 260. It can also be described as the gate spacer 234 having a recess towards one side facing the source/drain contact 268. The gate spacer 234 in contact with the conductive via 340 includes a thinner upper portion located between the conductive via 340 and the gate electrode 260 of the gate extension structure 272 and a wider lower portion located underneath the conductive via 340.

In this embodiment, the conductive via 340 is in contact with the side surface 268*s* of the source/drain contact 268, thereby increasing the contact area between the conductive via 340 and the source/drain contact 268. This leads to a reduction in the resistance between the conductive via 340 and the source/drain contact 268.

Figure 18:
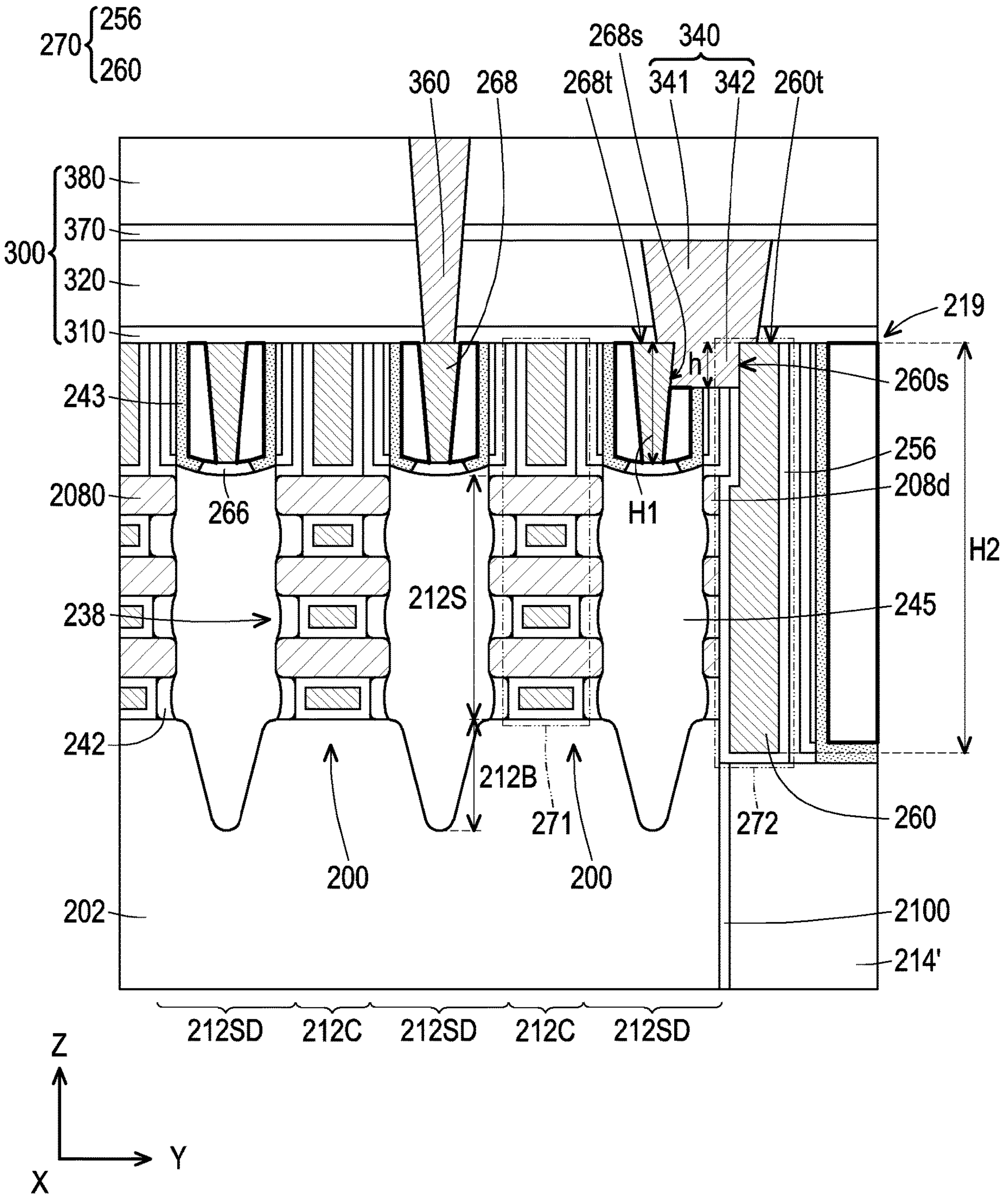
FIG. 18 illustrates a cross-section schematic diagram of a semiconductor device, according to still another embodiment of the present disclosure.

FIG. 18 shows a cross-section schematic diagram of a semiconductor device, according to another embodiment of the present disclosure. It should be noted herein that, in the embodiment provided in FIG. 18, element numerals and partial content of the embodiments provided in FIG. 2 to FIG. 16 are followed, the same or similar reference numerals being used to represent the same or similar elements, and description of the same technical content being omitted. For a description of an omitted part, reference may be made to the foregoing embodiment, and the descriptions thereof are omitted herein.

In the embodiment shown in FIG. 18, the interconnect structure 300 includes a stacked configuration from bottom to top, including a protective layer 310, an insulation layer 320, a protective layer 370, and an insulation layer 380. The insulation layer 320 is positioned above the protective layer 310, and the conductive via 340 passes through both the protective layer 310 and the insulation layer 320. The protective layer 370 is positioned above the insulation layer 320, and the insulation layer 380 is positioned above the protective layer 370. Additionally, the conductive via 360 penetrates through the protective layer 310, the insulation layer 320, the protective layer 370, and the insulation layer 380.

In this embodiment, the conductive via 360 and the conductive via 340 are formed using different deposition processes, and the top surface of the conductive via 360 is higher than the top surface of the conductive via 340.

In some embodiments, both the protective layer 310 and the protective layer 370 are made of the same material and can serve as etch stop layers. Similarly, in some embodiments, the insulation layer 320 and the insulation layer 380 are made of the same material.

Figure 19:
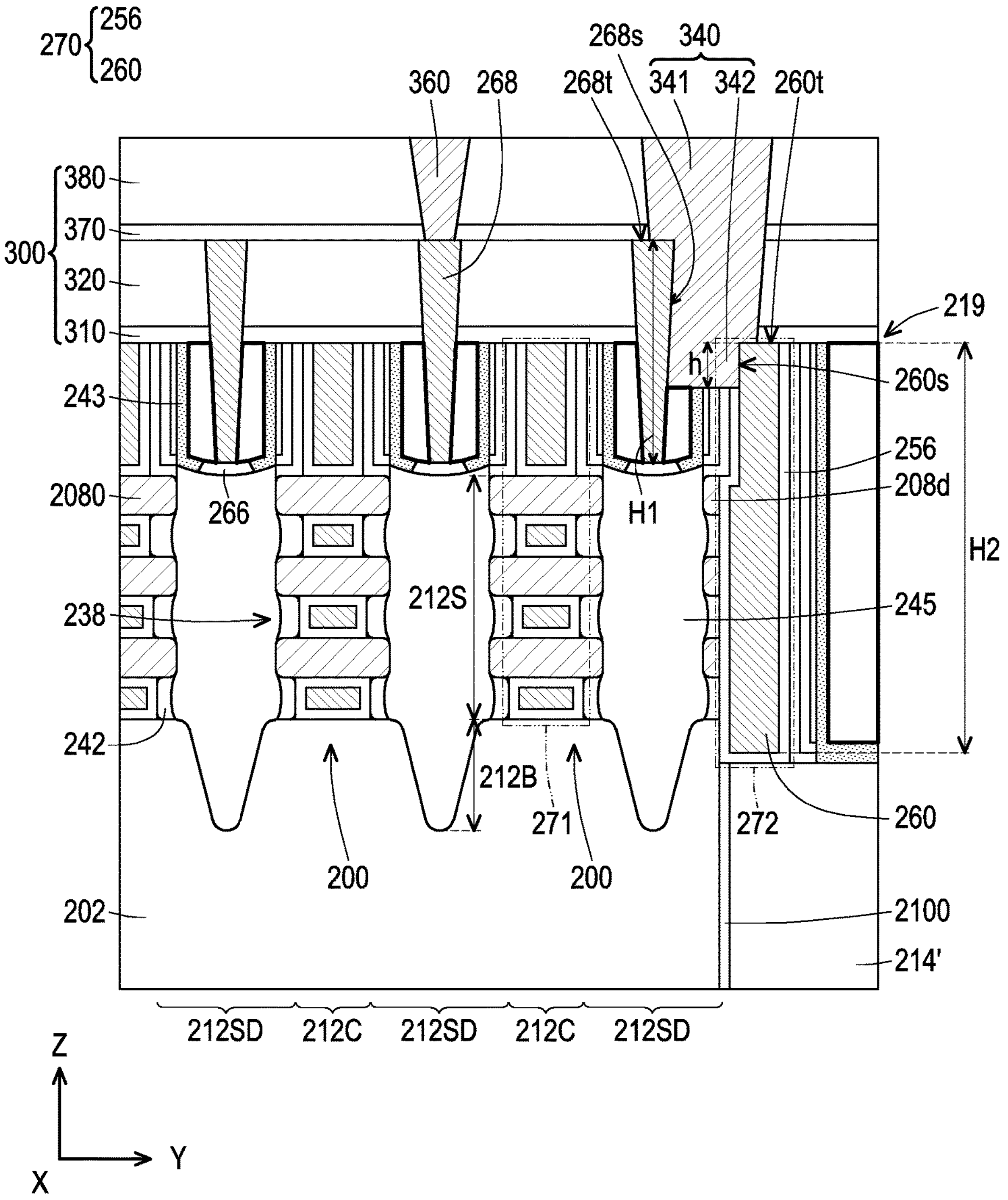
FIG. 19 illustrates a cross-section schematic diagram of a semiconductor device, according to still another embodiment of the present disclosure.

FIG. 19 shows a cross-section schematic diagram of a semiconductor device, according to another embodiment of the present disclosure. It should be noted herein that, in the embodiment provided in FIG. 19, element numerals and partial content of the embodiment provided in FIG. 18 are followed, the same or similar reference numerals being used to represent the same or similar elements, and description of the same technical content being omitted. For a description of an omitted part, reference may be made to the foregoing embodiment, and the descriptions thereof are omitted herein.

In the embodiment of FIG. 19, the source/drain contacts 268 extend from the interconnect structure 300 to the source/drain features 245. For example, after the formation of the insulation layer 320, an etching process is performed to form openings overlapping with the source/drain features 245, and then the source/drain contacts 268 are formed by filling the conductive material into the openings. The source/drain contacts 268 extend through the insulation layer 320, the protective layer 310, and the ILD layer 244. In this embodiment, the top surface of the source/drain contacts 268 is higher than the top surface of the gate structures 270.

In the embodiment of FIG. 19, the conductive via 360 and the conductive via 340 are formed using the same deposition process and both extend through the protective layer 310, the insulation layer 320, the protective layer 370, and the insulation layer 380.

Figure 20:
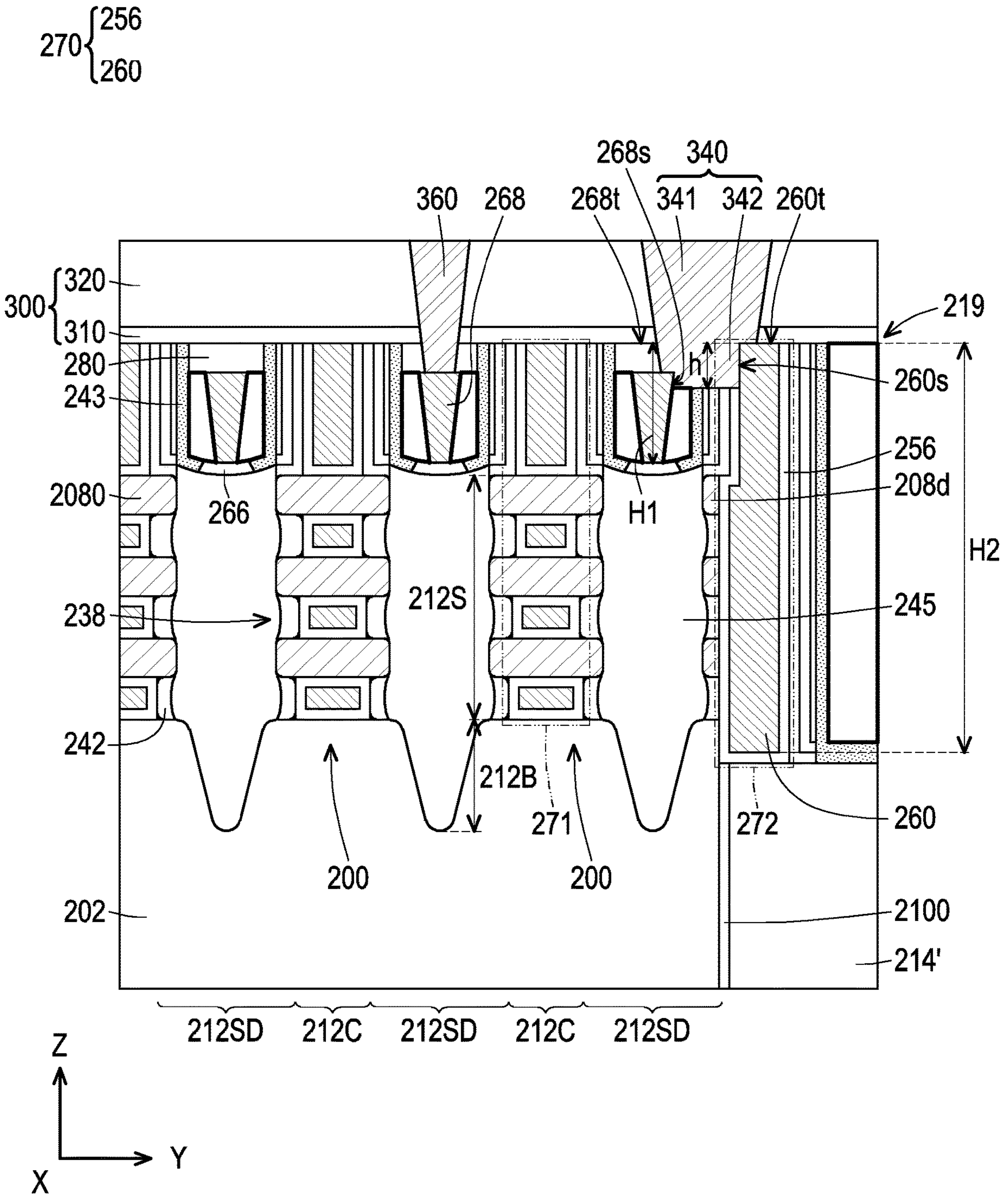
FIG. 20 illustrates a cross-section schematic diagram of a semiconductor device, according to still another embodiment of the present disclosure.

FIG. 20 shows a cross-section schematic diagram of a semiconductor device, according to another embodiment of the present disclosure. It should be noted herein that, in the embodiment provided in FIG. 20, element numerals and partial content of the embodiments provided in FIG. 2 to FIG. 16 are followed, the same or similar reference numerals being used to represent the same or similar elements, and description of the same technical content being omitted. For a description of an omitted part, reference may be made to the foregoing embodiment, and the descriptions thereof are omitted herein.

In the embodiment of FIG. 20, the top surface 268*t* of the source/drain contacts 268 is lower than the top surface of the gate structures 270. For example, after forming the source/drain contacts 268, a recessing process is performed on the source/drain contacts 268, causing the top surface 268*t* of the source/drain contacts 268 and the top surface of the ILD layer 244 to be recessed downward. Subsequently, an insulation layer 280 is deposited on the source/drain contacts 268 and the ILD layer 244. The insulation layer 280 can be used to prevent unintended electrical connections between the source/drain contacts 268 and the gate structures 270.

Figure 22:
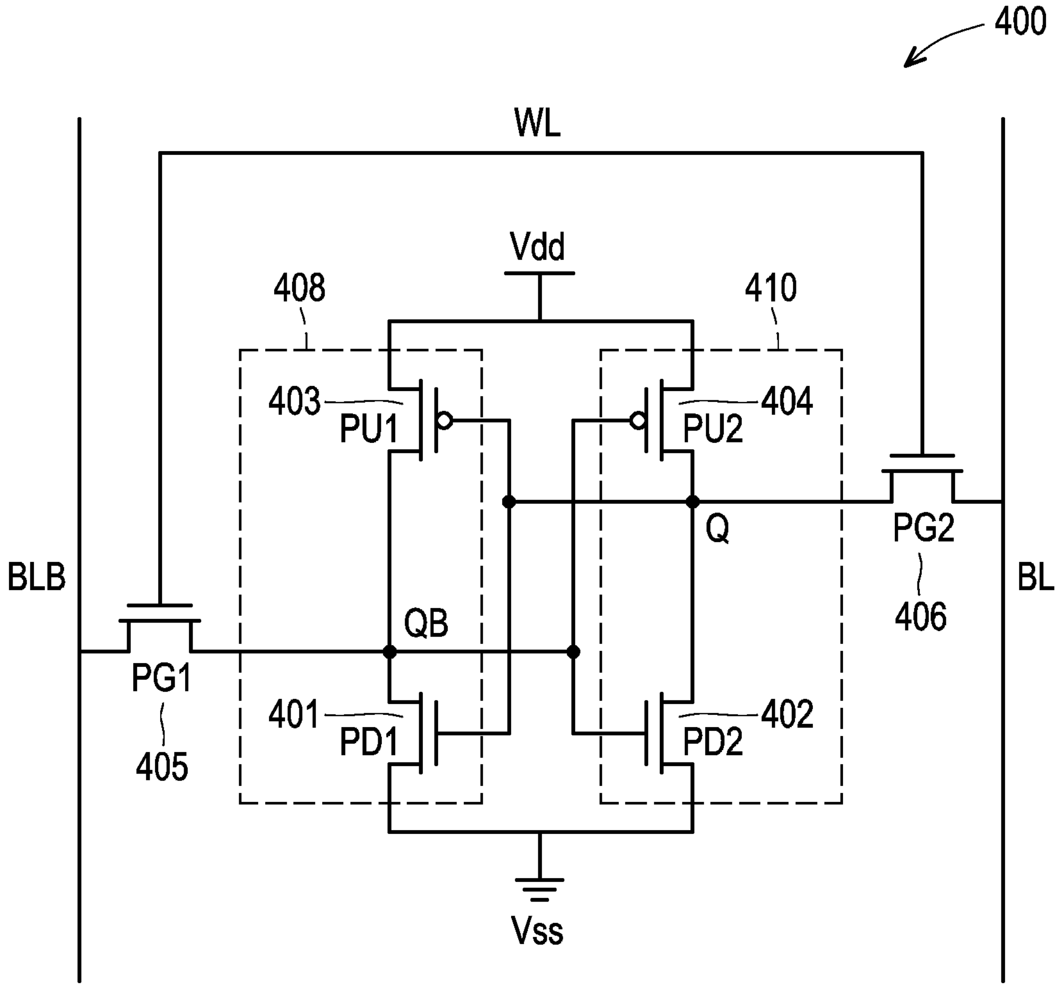
FIG. 22 illustrates a circuit diagram of an SRAM cell, according to one or more aspects of the present disclosure.

An example static random access memory (SRAM) cell 400 is illustrated in FIG. 22. The SRAM cell 400 includes first and second pass-gate transistors (PG1) 405 and (PG2) 406, first and second pull-up transistors (PU1) 403 and (PU2) 404, and first and second pull-down transistors (PD1) 401 and (PD2) 402. In SRAM cell 400, each of the pass-gate transistors, pull-up transistors and pull-down transistors may be a multi-gate transistor, such as an GAA transistor. The gates of the first pass-gate transistor (PG1) 405 and second pass-gate transistors (PG2) 406 are electrically coupled to a word line (WL) that determines whether the SRAM cell 400 is selected/activated or not. In the SRAM cell 400, a memory bit (e.g., a latch or a flip-flop) is formed of the first pull-up transistor (PU1) 403, the second pull-up transistor (PU2) 404, the first pull-down transistor (PD1) 401, and the second pull-down transistor (PD2) 402 to store a bit of data. The complementary values of the bit are stored in a first storage node QB and a second storage node Q. The stored bit can be written into, or read from, the SRAM cell 400 through Bit-line (BL) and Bit-Line Bar (BLB). In this arrangement, the BL and BLB may carry complementary bit-line signals. The SRAM cell 400 is powered through a voltage bus that has a positive power supply voltage (Vdd) and is also connected to a ground potential bus at ground potential (Vss). The SRAM cell 400 includes six (6) transistors and may be referred to as a 6T SRAM cell.

The SRAM cell 400 includes a first inverter 408 formed of the first pull-up (PU1) transistor 403 and the first pull-down transistor (PD1) 401 as well as a second inverter 410 formed of the second pull-up transistor (PU2) 404 and the second pull-down transistor (PD2) 402. The first inverter 408 and the second inverter 410 are coupled between the positive power supply voltage (Vdd) and the ground potential (Vss). As shown in FIG. 22, the first inverter 408 and the second inverter 410 are cross-coupled. That is, the first inverter 408 has an input coupled to the output of the second inverter 410. Likewise, the second inverter 410 has an input coupled to the output of the first inverter 408. The output of the first inverter 408 is the first storage node QB. Likewise, the output of the second inverter 410 is the second storage node Q. In a normal operating mode, the first storage node QB is in the opposite logic state as the second storage node Q. By employing the two cross-coupled inverters, the SRAM cell 400 can hold the data using a latched structure so that the stored data will not be lost without applying a refresh cycle as long as power is supplied through Vdd.

Figure 23:
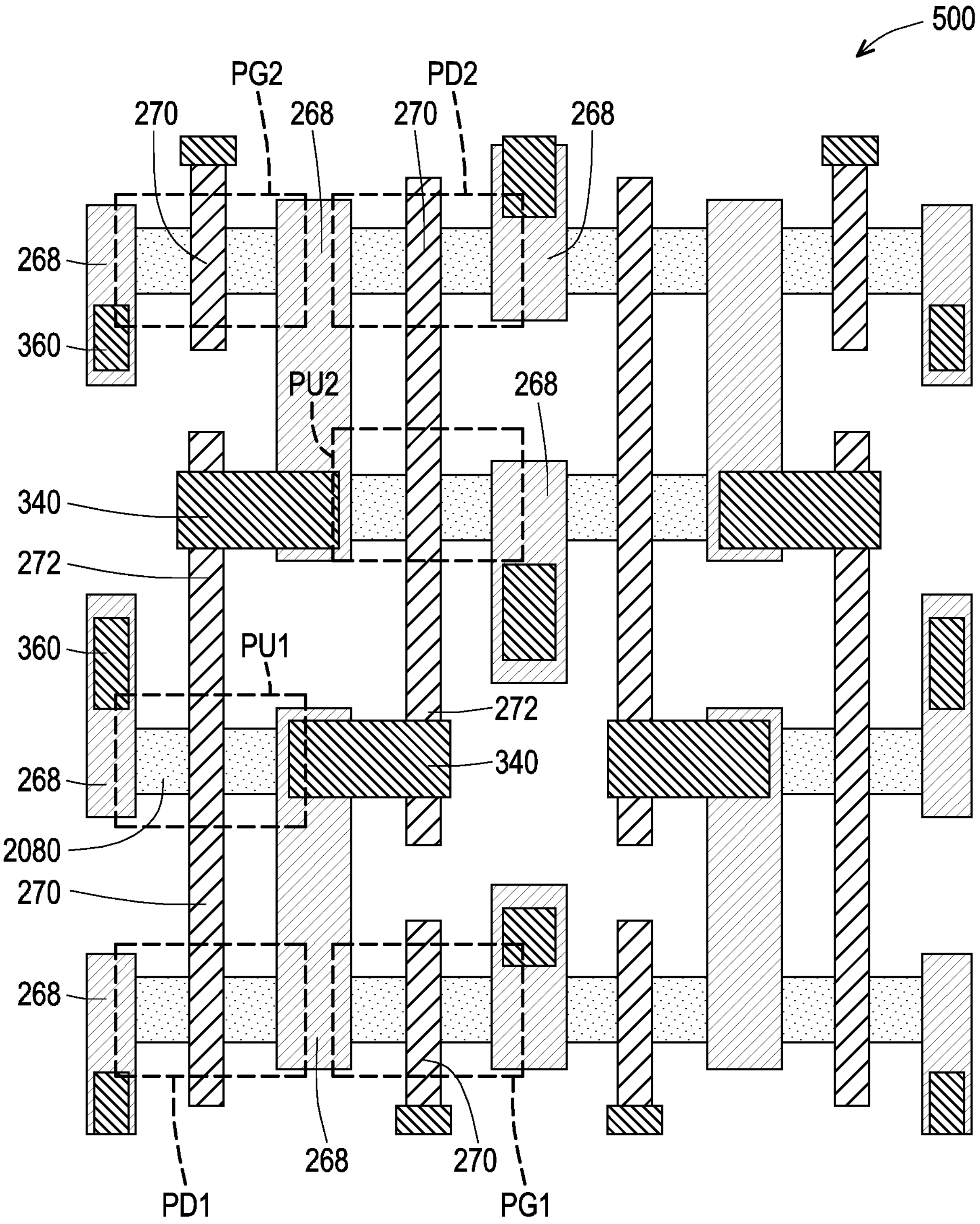
FIG. 23 illustrates a layout for implementing the SRAM cell in FIG. 22, according to one or more aspects of the present disclosure.

Referring to FIGS. 22 and 23, the SRAM cell 400 may be implemented using a layout 500. In layout 500, the gate structure 270 of the first pull-up (PU1) transistor 403 is directly connected with the gate structure 270 of the first pull-down transistor (PD1) 401. The gate structure 270 of the second pull-up transistor (PU2) 404 is directly connected with the gate structure 270 of the second pull-down transistor (PD2) 402.

One of the source/drain contacts 268 of the first pull-up (PU1) transistor 403 and is electrically coupled to the gate structure 270 of the second pull-up transistor (PU2) 404 by the conductive via 340. One of the source/drain contacts 268 of the second pull-up transistor (PU2) 404 and is electrically coupled to the gate structure 270 of the first pull-up (PU1) transistor 403 by another conductive via 340. As depicted in FIG. 16, the conductive via 340 can extend into the area between the gate extension structure 272 and the adjacent source/drain contact 268. This reduces the resistance between the source/drain contacts 268 and the gate structure 270. Therefore, even if the top surface area of the source/drain contacts 268 and the gate structure 270 is small, sufficient conduction pathways can be provided through the conductive via 340.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In one exemplary aspect, a semiconductor device includes a first transistor, a second transistor and an interconnect structure. The first transistor includes a first gate structure, a first channel structure, a first source/drain feature, a second source/drain feature, a first source/drain contact and a second source/drain contact. The first channel structure is overlapping with the first gate structure. The first source/drain feature and the second source/drain feature are electrically connected with the first channel structure. The first source/drain contact and the second source/drain contact are respectively electrically connected with the first source/drain feature and the second source/drain feature. The second transistor includes a second gate structure and a second channel structure overlapping with the second gate structure. The interconnect structure is disposed over the first transistor and the second transistor. The interconnect structure includes a first conductive via electrically connecting the first source/drain contact to the second gate structure, and the first conductive via is in contact with a top surface of the first source/drain contact and a side surface of the first source/drain contact.

In another exemplary aspect, a static random access memory (SRAM) cell includes a first pull-up GAA transistor and a first pull-down GAA transistor coupled together to form a first inverter, a second pull-up GAA transistor and a second pull-down GAA transistor coupled together to form a second inverter, and a first pass-gate GAA transistor coupled to an output of the first inverter and an input of the second inverter. A source/drain contact of the first pull-up GAA transistor is electrically connected with a gate structure of the second pull-down GAA transistor through a conductive feature of an interconnect structure. The conductive feature is in contact with a top surface of the source/drain contact and a side surface of the source/drain contact.

In yet another exemplary aspect, a semiconductor structure includes a first GAA structure located between a first source/drain feature and a second source/drain feature, a first gate electrode surrounding the first GAA structure, a first source/drain contact and a second source/drain contact respectively disposed above the first source/drain feature and the second source/drain feature, a second gate electrode, and a conductive feature disposed above the first source/drain contact and the second gate electrode. The first source/drain feature is located between the first gate electrode and the second gate electrode. The conductive feature electrically connects the first source/drain contact to the second gate electrode. The conductive feature is extending along a portion of a top surface of the first source/drain contact and a portion of a side surface of the first source/drain contact.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a first transistor, comprising:
- a first gate structure;
- a first channel structure, overlapping with the first gate structure;
- a first source/drain feature and a second source/drain feature, electrically connected with the first channel structure;
- a first source/drain contact and a second source/drain contact, respectively electrically connected with the first source/drain feature and the second source/drain feature;

a second transistor, comprising:
- a second gate structure;
- a second channel structure, overlapping with the second gate structure; and an interconnect structure, disposed over the first transistor and the second transistor, wherein the interconnect structure comprises:
- a first conductive via, extending from a top surface of the first source/drain contact and a top surface of the second gate structure into a gap between a side surface of the first source/drain contact and a side surface of the second gate structure, electrically connecting the first source/drain contact to the second gate structure, and in contact with the top surface of the first source/drain contact and the side surface of the first source/drain contact.

2. The semiconductor device of claim 1, wherein the first conductive via is in contact with the top surface of the second gate structure.

3. The semiconductor device of claim 1, wherein the first source/drain contact and the second source/drain contact are embedded in an interlayer dielectric layer disposed above the first source/drain feature and the second source/drain feature, and the first conductive via extends from a top surface of the interlayer dielectric layer into the interlayer dielectric layer.

4. The semiconductor device of claim 3, wherein a portion of the second gate structure is laterally located between a pair of gate spacers, an etching stop layer is disposed on the gate spacers, and the interlayer dielectric layer is disposed on the etching stop layer, one of the pair of the gate spacers is located underneath the first conductive via, a height of a first side of the one of the pair of the gate spacers is less than a height of a second side of the one of the pair of the gate spacers in a cross-sectional view, and the first side is closer to the first source/drain contact than the second side.

5. The semiconductor device of claim 3, wherein a portion of the second gate structure is laterally located between a pair of gate spacers, an etching stop layer is disposed on the gate spacers, and the interlayer dielectric layer is disposed on the etching stop layer, wherein a portion of the first conductive via is in contact with and located between one of the pair of the gate spacers and the first source/drain contact.

6. The semiconductor device of claim 3, wherein the interlayer dielectric layer is located above the first source/drain feature and the second source/drain feature, and the first source/drain contact and the second source/drain contact are penetrating through the interlayer dielectric layer and respectively electrically connected with the first source/drain feature and the second source/drain feature.

7. The semiconductor device of claim 3, wherein a top surface of the interlayer dielectric layer is coplanar with the top surface of the first source/drain contact.

8. The semiconductor device of claim 1, further comprising a dummy channel structure laterally located between the second gate structure and the first source/drain feature.

9. The semiconductor device of claim 1, wherein the interconnect structure comprises:

a first protective layer, extending from the top surface of the first source/drain contact to a top surface of the first gate structure; and a first insulation layer, disposed above the first protective layer, wherein the first conductive via is penetrating through the first protective layer and the first insulation layer.

10. A static random access memory (SRAM) cell, comprising:

a first pull-up gate-all-around (GAA) transistor and a first pull-down GAA transistor coupled together to form a first inverter;

a second pull-up GAA transistor and a second pull-down GAA transistor coupled together to form a second inverter;

a first pass-gate GAA transistor coupled to an output of the first inverter and an input of the second inverter; and wherein a source/drain contact of the first pull-up GAA transistor is electrically connected with a gate structure of the second pull-down GAA transistor through a conductive feature of an interconnect structure, the conductive feature is in contact with a top surface of the source/drain contact and a side surface of the source/drain contact, and a portion of the conductive feature is laterally located between the side surface of the source/drain contact and a side surface of the gate structure of the second pull-down GAA transistor.

11. The SRAM cell of claim 10, wherein the top surface of the source/drain contact of the first pull-up GAA transistor is coplanar with a top surface of the gate structure of the second pull-down GAA transistor.

12. The SRAM cell of claim 10, wherein the source/drain contact is surrounded by an interlayer dielectric layer.

13. The SRAM cell of claim 10, wherein the interconnect structure comprises:

a first protective layer, disposed above the gate structure of the second pull-down GAA transistor and the source/drain contact; and a first insulation layer, disposed above the first protective layer, wherein the conductive feature is penetrating through the first protective layer and the first insulation layer.

14. A semiconductor structure, comprising:

a first gate-all-around (GAA) structure located between a first source/drain feature and a second source/drain feature;

a first gate electrode surrounding the first GAA structure;

a first source/drain contact and a second source/drain contact, respectively disposed above the first source/drain feature and the second source/drain feature;

a second gate electrode, wherein the first source/drain feature is located between the first gate electrode and the second gate electrode;

a conductive feature disposed above the first source/drain contact and the second gate electrode, and the conductive feature electrically connects the first source/drain contact to the second gate electrode, wherein the conductive feature is extending along a portion of a top surface of the first source/drain contact and a portion of a side surface of the first source/drain contact; and a gate spacer, disposed between the second gate electrode and the first source/drain contact, wherein a height of a first side of the gate spacer is lower than a height of a second side of the gate spacer in a cross-sectional view, and the first side of the gate spacer is closer to the first source/drain contact than the second side of the gate spacer.

15. The semiconductor structure of claim 14, further comprising:

a dummy channel structure laterally located between the second gate electrode and the first source/drain feature.

16. The semiconductor structure of claim 15, further comprising:

a gate dielectric layer, disposed between the first GAA structure and the first gate electrode and between the dummy channel structure and the second gate electrode.

17. The semiconductor structure of claim 14, further comprising:

an interlayer dielectric layer, disposed above the first source/drain feature and the second source/drain feature, and the first source/drain contact and the second source/drain contact are embedded in the interlayer dielectric layer;

an etching stop layer, surrounding the interlayer dielectric layer, wherein the gate spacer is disposed on the etching stop layer, and the conductive feature is in contact with and located above the gate spacer.

18. The semiconductor structure of claim 17, wherein a portion of the conductive feature is laterally located between the side surface of the first source/drain contact and a side surface of the second gate electrode.

19. The semiconductor structure of claim 17, wherein the gate spacer comprises a thinner upper portion located between the conductive feature and the second gate electrode and a wider lower portion located underneath the conductive feature.

20. The semiconductor structure of claim 14, wherein the conductive feature is in contact with a top surface of the second gate electrode.

* * * * *